(12) United States Patent  
Clidaras et al.

(10) Patent No.: US 8,456,840 B1  
(45) Date of Patent: Jun. 4, 2013

(54) MODULAR DATA CENTER COOLING

(75) Inventors: Jimmy Clidaras, Los Altos, CA (US); William Hamburgen, Palo Alto, CA (US); Winnie Leung, Palo Alto, CA (US); David W. Stiver, Santa Clara, CA (US); Andrew B. Carlson, Atherton, CA (US); Steven T. Y. Chow, Foster City, CA (US); Jonathan D. Beck, Mountain View, CA (US)

(73) Assignee: Exaflop LLC, Mountain View, CA (US)

( * ) Notice: Subject to any disclaimer, the term of this patent is extended or adjusted under 35 U.S.C. 154(b) by 0 days.

(21) Appl. No.: 13/093,098

(22) Filed: Apr. 25, 2011

Related U.S. Application Data

(63) Continuation of application No. 12/202,991, filed on Sep. 2, 2008, now abandoned, which is a continuation-in-part of application No. 11/774,257, filed on Jul. 6, 2007, now abandoned.

(60) Provisional application No. 60/969,577, filed on Aug. 31, 2007.

(51) Int. Cl.  
*H05K 7/20* (2006.01)

(52) U.S. Cl.  
USPC .......... 361/695; 361/679.47; 361/679.48; 361/679.53; 361/696; 165/80.5; 165/104.22; 165/104.33; 454/184; 62/259.2

(58) Field of Classification Search  
USPC .......... 361/679.46–679.53, 690–697, 688, 361/689, 698, 699, 717–728; 165/80.2, 80.4, 165/80.5, 104.33, 104.34, 185, 104.25, 104.31, 165/110, 285; 62/99, 186, 305, 259.2; 312/223.2, 223.3, 236; 454/184  
See application file for complete search history.

(56) References Cited

U.S. PATENT DOCUMENTS

| | | | |
|---|---|---|---|
| 4,429,734 A | 2/1984 | Vandervaart | |
| 5,345,779 A | 9/1994 | Feeney | |
| 5,995,368 A | 11/1999 | Lee et al. | |
| 6,034,873 A | 3/2000 | Ståhl et al. | |
| 6,672,955 B2 | 1/2004 | Charron | |
| 6,817,199 B2 | 11/2004 | Patel et al. | |
| 6,859,366 B2 * | 2/2005 | Fink | 361/690 |
| 6,886,353 B2 | 5/2005 | Patel et al. | |
| 6,909,611 B2 * | 6/2005 | Smith et al. | 361/727 |
| 7,046,514 B2 | 5/2006 | Fink et al. | |
| 7,126,820 B2 * | 10/2006 | Wei | 361/695 |
| 7,165,412 B1 * | 1/2007 | Bean, Jr. | 62/259.2 |
| 7,278,273 B1 * | 10/2007 | Whitted et al. | 62/259.2 |
| 7,325,410 B1 * | 2/2008 | Bean, Jr. | 62/137 |
| 7,366,663 B2 | 4/2008 | Beerends et al. | |

(Continued)

FOREIGN PATENT DOCUMENTS

GB 2444981 A * 6/2008  
JP 2003166729 A 6/2003

*Primary Examiner* — Michail V Datskovskiy  
(74) *Attorney, Agent, or Firm* — Fish & Richardson P.C.

(57) ABSTRACT

A rack-mount computer system includes one or more rows of computer racks, wherein each row of computer racks includes a pair of rows of computer racks positioned back-to-back relative to each other, a plurality of computer motherboards mounted in each of the racks in each row of computer racks and having front edges open to a workspace for receiving circulating air over the motherboards, the motherboards positioned to create a warm air plenum near a back edge of each motherboard, and a fan positioned adjacent each of the plurality of computer motherboards to circulate air across the computer motherboards and into the warm air plenum.

32 Claims, 12 Drawing Sheets

U.S. PATENT DOCUMENTS

| | | |
|---|---|---|
| 7,370,489 B2 | 5/2008 | Rios et al. |
| 7,418,825 B1 | 9/2008 | Bean, Jr. |
| 7,430,118 B1 * | 9/2008 | Noteboom et al. ............ 361/695 |
| 7,508,663 B2 * | 3/2009 | Coglitore ...................... 361/695 |
| 7,669,641 B2 | 3/2010 | Rembold et al. |
| 7,672,128 B2 * | 3/2010 | Noteboom et al. ............ 361/696 |
| 7,841,199 B2 * | 11/2010 | VanGilder et al. ............ 62/259.2 |
| 2005/0168945 A1 * | 8/2005 | Coglitore ...................... 361/695 |
| 2005/0235671 A1 | 10/2005 | Belady et al. |
| 2005/0237716 A1 * | 10/2005 | Chu et al. ...................... 361/696 |
| 2005/0280986 A1 * | 12/2005 | Coglitore et al. ............. 361/687 |
| 2009/0014397 A1 | 1/2009 | Moss et al. |
| 2009/0029640 A1 | 1/2009 | Densham |

* cited by examiner

MODULAR DATA CENTER COOLING

CROSS-REFERENCE TO RELATED APPLICATIONS

This application is a continuation of U.S. application Ser. No. 12/202,991, filed Sep. 2, 2008, which is a continuation-in-part of U.S. application Ser. No. 11/774,257, filed Jul. 6, 2007, and this application further claims priority to U.S. provisional application Ser. No. 60/969,577, filed Aug. 31, 2007. The entire contents of these earlier applications are incorporated herein by reference.

TECHNICAL FIELD

This document discusses techniques for providing ventilation and cooling to facilities hosting electronic equipment, such as computer data centers.

BACKGROUND

When discussing the "power" of computers, people typically focus on speed—so-called processing power. The electrical power consumed by the computers gets less attention. But to people who operate computer data centers—facilities that contain hundreds or thousands (or tens of thousands) of computers serving requests from remote users—the electrical power can be every bit as important as the processing power. Each computer can consume several hundreds watts—the same as several floodlights. Multiplying that total across thousands of computers should make plain that the potential consumption level can be fairly high.

The operating computers convert much of that consumed electricity into heat. And that heat has to be removed. So operating a data center is like an electrical double whammy—you have to pay once to use the electricity, and you have to pay again to remove the effects of the use of the electricity (which itself requires more electricity). The effects of power consumed by the critical load in the data center are thus compounded when one incorporates all of the ancillary equipment required to support the critical load, such as pumps, chillers, and other such components.

SUMMARY

This document describes systems and methods that may be employed to provide cooling for facilities hosting electronic equipment. The techniques described here may, in certain implementations, provide data center operators with flexibility in layout, and may provide for high-volume heat removal using relatively simple and inexpensive equipment. In addition, in certain implementations, much of the equipment may be pre-fabricated and tested at a factory, and then quickly installed and commissioned on-site, so as to provide for faster "go-live" time for a facility, and to allow for less expensive, but more dependable, equipment construction.

In general, as described below, modular units may be provided to capture warm air that exits rack servers or other such devices to prevent the warm air from escaping and mixing with the ambient air in a data center. The modular units may then cool the captured warm air and provide the cooled air back into the ambient space, where it can be circulated through the rack servers or other equipment again. The modular units may be configured so that captured air may pass between the units, so that if one unit is not working well or is otherwise overloaded, air from it may pass to other units. Also, space may be provided between units that are aligned in a row in certain implementations, and warmed air may be captured in the space and then drawn into adjacent units. In this manner, for example, cooling capacity may be matched better to heat generated by the cooling load (the electronic equipment), particularly if the load varies from rack to rack, or if the load changes over time.

In addition, the units may be spaced, in X and Y directions, so that structural columns in a facility (or other interruptions in a floor plate) are all or mostly located in the empty warm air plenum created in a row of cooling units, in the spaces between cooling units. In this manner, the structural columns can effectively disappear in the data center space.

In one implementation, a datacenter cooling apparatus is disclosed. The apparatus includes a portable housing having lifting and transporting structures for moving the apparatus; opposed sides in the housing, at least one of the opposed sides defining one or more air passage openings configured to capture warmed air from rack-mounted electronics; opposed ends in the housing, at least one of the opposed ends defining one or more air passage openings positioned to allow lateral passage of captured air into and out of the housing; and one or more cooling coils associated with the housing to receive and cool the captured warm air, and provide the cooled air for circulation into a datacenter workspace. The opposed sides can each define openings to engage with back-to-back computer racks. The apparatus can also include computer racks on opposed sides of the apparatus, and positioned to provide warm air to the apparatus. In addition, the apparatus can include a space inside the housing between the opposed faces in the warm-air plenum whereby warm air may pass from one of the one computer rack to an opposed computer rack.

In certain aspects, the apparatus can comprise skid mounts on the housing to permit movement of the apparatus using a mechanical lift. The housing can define a width along the ends and a length along the sides that is greater than the width, and wherein the length is between about six feet and about eight feet. In addition, one or more fans mounted on the apparatus can be provided and can be positioned to circulate air from the electronics through the cooling coils and into the datacenter workspace. The one or more fans can be located near a top edge of the housing and can be positioned to blow air vertically upward. The coil can itself be mounted horizontally below the fans. In addition, the coil can be rotatable into a vertical orientation for servicing. Moreover, the one or more fans can be located on replaceable mounts with associated fan controllers.

In certain aspects, the one or more cooling coils are arranged in a V-formation and form a cool-air plenum that is separate from the warm air capture plenum. The apparatus can also comprise a wiring rack supported by the housing for holding networking cable in a position to be interfaced with the rack-mounted computers. In addition, the apparatus can include anchors on the housing having attachment points for computer racks to provide seismic support for the racks. Furthermore, the apparatus may comprise a barrier near a periphery of the housing, the barrier having sealed openings for permitting passage of cooling water piping to the cooling coils. The openings can be in a floor of the apparatus and define an opening longitudinal axis that forms a substantial angle with an apparatus longitudinal access so as to permit positioning of piping along a diagonal of the apparatus. Moreover, the apparatus can include rollers located near a bottom portion of the apparatus configured to engage tracks for permitting lateral movement of the apparatus.

In another implementation, a data center cooling system is disclosed that includes a plurality of apparatuses just discussed. The apparatuses in the system can be positioned in one or more end-to-end, substantially linear arrangements, and computer racks can be located on opposed sides of the apparatuses. Also, the plurality of apparatuses can define an apparatus pitch and the computer racks can define one or more rack pitches, wherein the apparatus pitch differs substantially from the rack pitches. Two or more of the plurality of apparatuses can be separated by an end-to-end distance.

In yet another implementation, a data center cooling system is disclosed. The system comprises a plurality of cooling modules aligned end-to-end in one or more rows, sides on the cooling modules defining openings for capturing warm air from electronics racks mounted to the cooling modules, and ends on the cooling modules defining openings for passing air into and out of the cooling modules along a row of cooling modules, wherein the cooling modules in a row are positioned to have open spaces between adjacent cooling modules and wherein the spaces are sufficiently sealed form a data center workspace to form a warm air capture zone. The system may further comprise one or more cooling coils in each cooling module positioned between the warm air capture zone and a circulation fan suction zone. The cooling coil, for its part, can include a pair of opposed coils in a V formation, and the system may also include one or more fans associated with each cooling module for drawing warm air through the cooling coils.

In certain aspects, the system also includes electronic equipment racks in rows on opposed sides of the cooling unit rows to provide warm air to the cooling units. Also, the cooling units may define a cooling unit pitch and the electronic equipment racks may define one or more rack pitches, wherein the apparatus pitch differs substantially from the rack pitches. In addition, the warm air capture plenum can be contiguous along an entire row of the data center. Also, the cooling units in one or more rows can be unevenly spaced along the one or more rows. In addition, the system can include wiring racks supported by the cooling units for holding networking cable in a position to be interfaced with electronic equipment cooled by the system.

In other aspects, the system can also have a plurality of support structures extending upward from a data center floor and forming a plurality of rows of support structures, wherein each of the rows of cooling units envelops a row of support structures so that the support structures are out of a working area of the data center. The cooling units can comprise air cooling and circulation units having one or more air circulation fans and one or more cooling coils, and can define spaces between adjacent cooling units, and the support structures are located in the defined spaces. The system can also include a plurality of computer server racks defining substantially linear rows on opposed sides of each of the rows of cooling units.

In another implementation, a method of constructing a computer data center is disclosed, and comprises identifying a support grid comprised of a plurality of building supports in the computer data center, identifying a plurality of rows defined in the support grid, and positioning modular cooling units in a substantially linear arrangement along the plurality of rows defined in the support grid, with building supports located between the modular cooling units.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
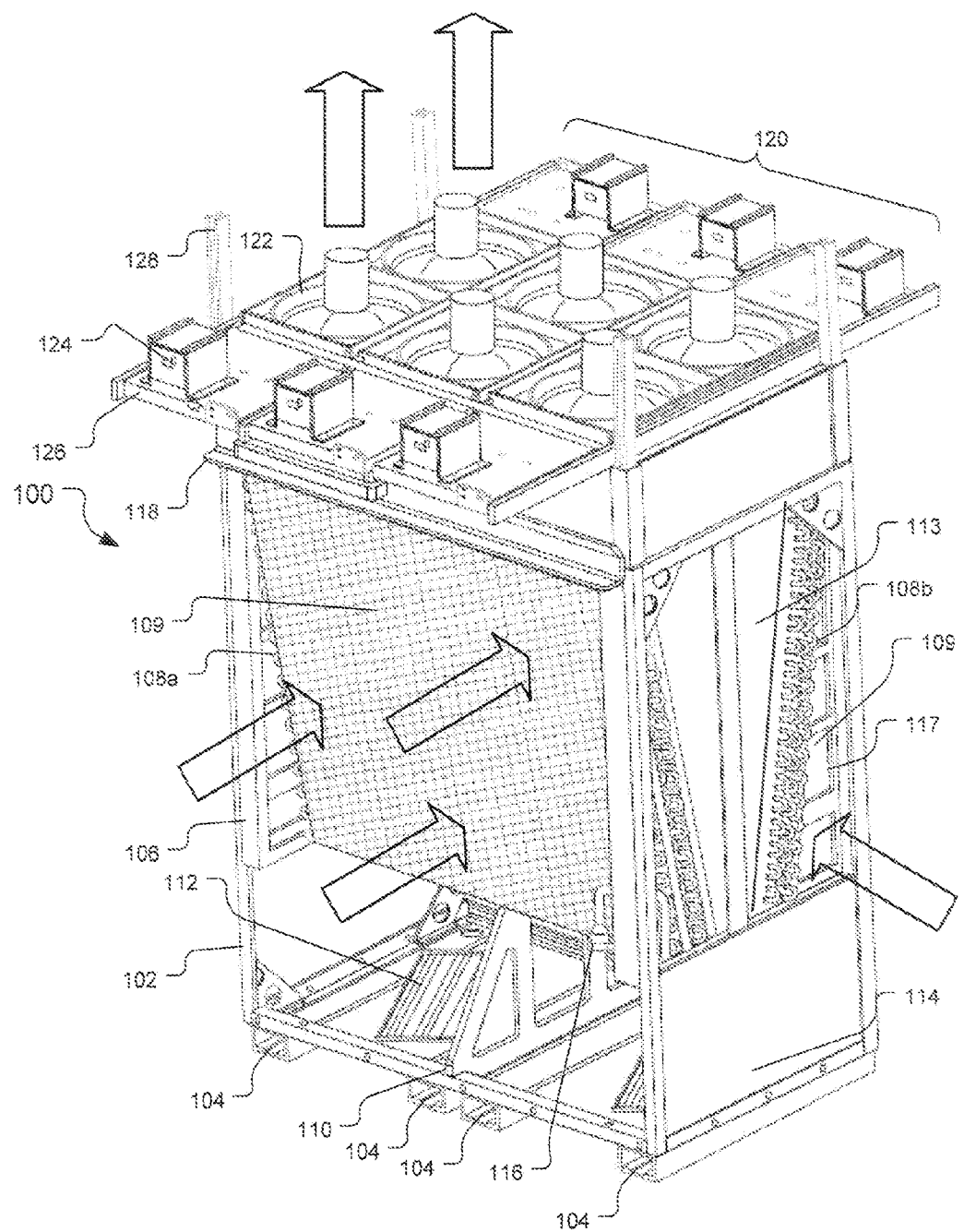
FIG. 1A shows a perspective view of a modular data center cooling apparatus.
Figure 1B:
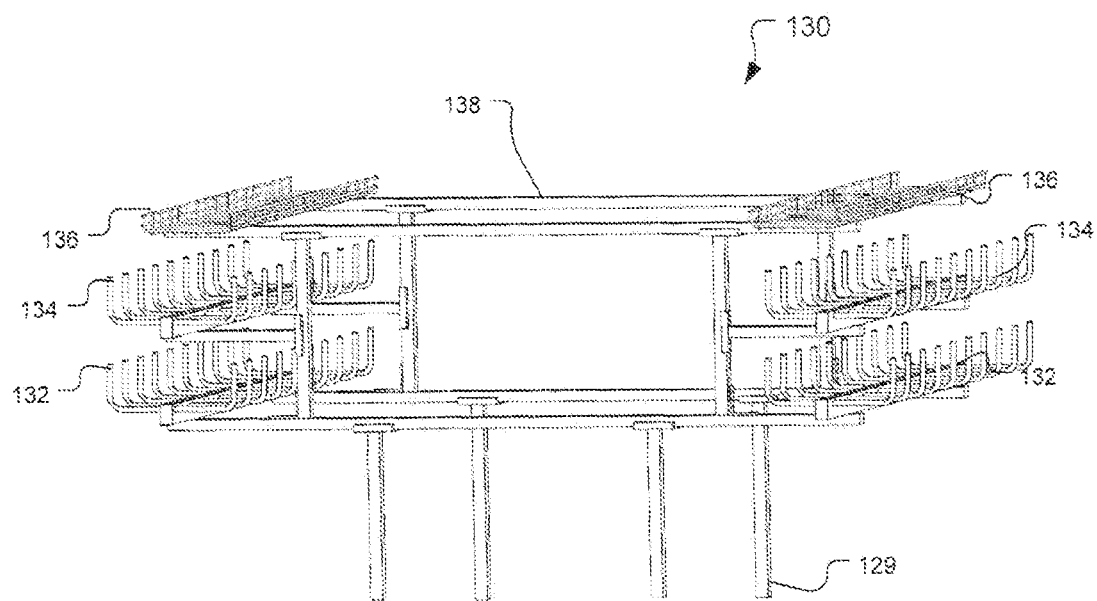
FIG. 1B shows a perspective view of a cable rack for use in a data center.
Figure 1C:
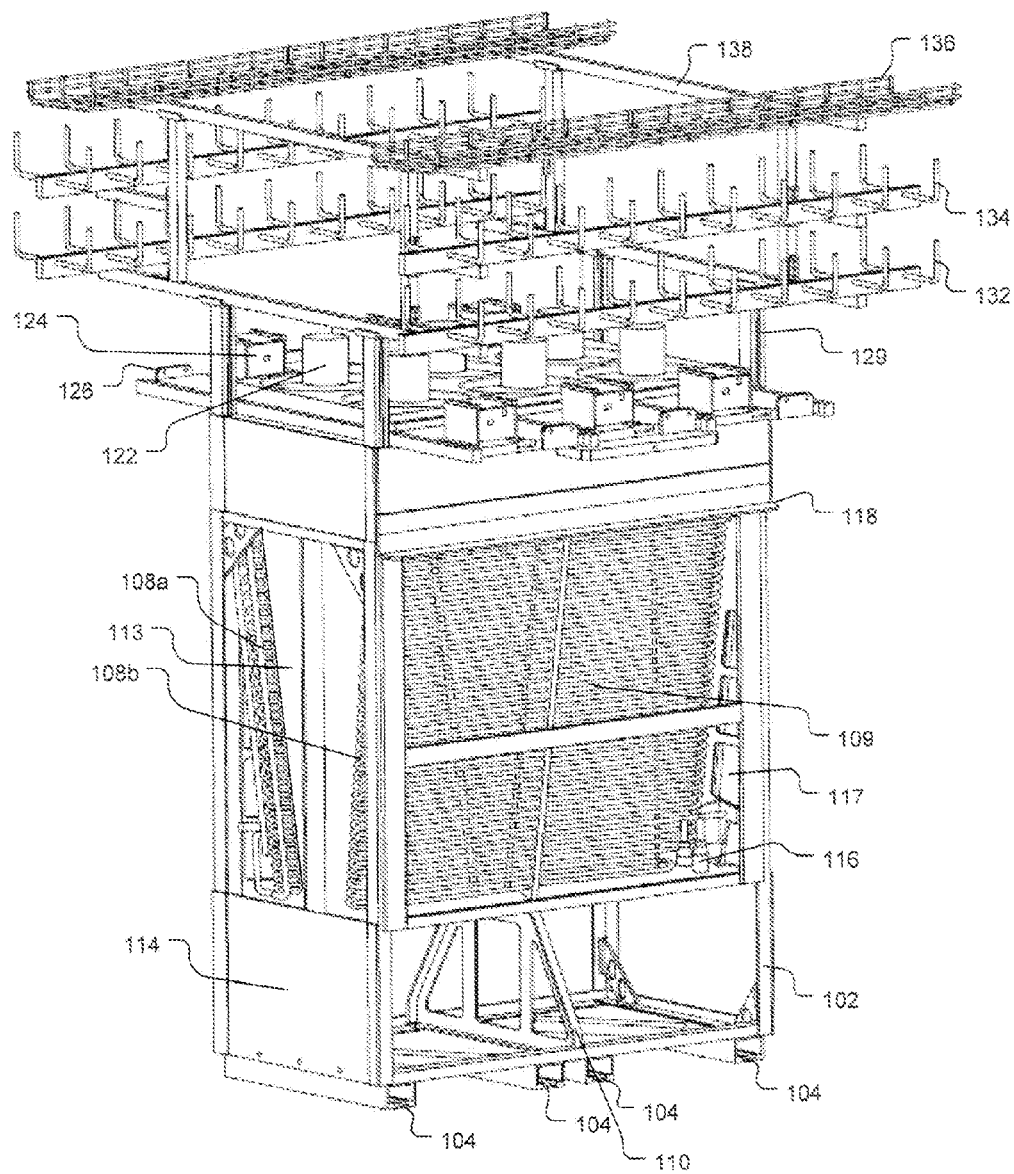
FIG. 1C shows the cable rack of FIG. 1B mounted to the top of the data center cooling apparatus of FIG. 1A.

FIG. 1A shows a perspective view of a modular data center cooling apparatus 100. FIG. 1B shows a perspective view of a cable rack 130 for use in a data center. FIG. 1C shows the cable rack of FIG. 1B mounted to the top of the data center cooling apparatus of FIG. 1A. In general, the apparatus 100 in the figures is an example of an apparatus that may be joined with computer racks in a data center to cool warmed air that passes over the computer racks, and to circulate the cooled air back into a workspace, where it may be drawn across the computer racks again.

To do so, the apparatus 100 may be located in a long row (e.g., 20 feet or more) of similar apparatuses that are sandwiched between rows of computer racks, such as in a relatively large data center. The back edges of the racks (i.e., the edges that are away from a workspace and are generally inaccessible) may contact the apparatus 100, and air may be drawn in the front of the computer racks (i.e., the side toward the workspace from which the racks are generally accessed), across various computing components such as processors and power supplies, and exhausted out the back of the racks to an opening in a side wall of the apparatus 100. The apparatus (or other apparatuses in the row) may then cool the air and recirculate it back into the workspace.

As shown, the apparatus 100 generally has a rectangular-shaped housing 102 that supports a variety of cooling and air circulating components. The primary components in this example are cooling coils 108a, 108b, and a fan set 120. In a general installation, computer racks are arrayed in rows on opposed sides of the apparatus 100, i.e., creating a rack-apparatus-rack sandwich. The coils 108a, 108b define a warm air capture plenum 109 on one side of each coil, nearest the computer racks (not shown), and a cool air plenum (hidden in the figures) on their other side of the coils, which is in communication with the fans in the fans set 120.

The apparatus 100 pulls air through the opposed sets of racks where it is warmed, captures the warm air in the warm air capture plenum 109, draws the air through the coils 108a, 108b using the fan set 120, and exhausts the cooled air, which in this example, occurs in an upward direction. The removed air is then replaced by more air moving across computers in the computer racks (e.g., passing over the components on a motherboard), and the cool air is expelled into the workspace to replace air in the workspace that has been drawn into the computer racks. Thus, a fairly simple air circulation pattern may be established.

Figure 4:
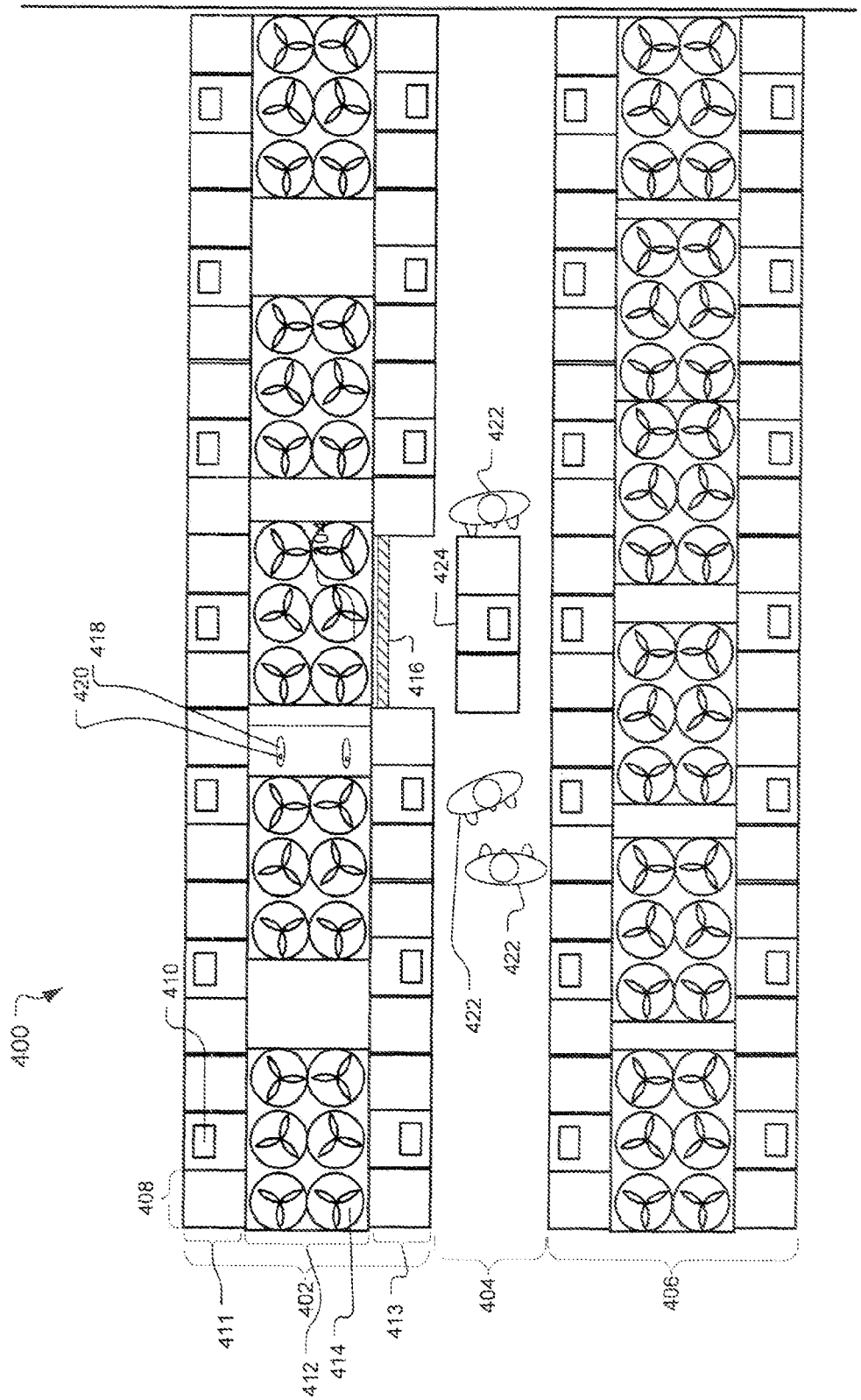
FIG. 4 shows a plan view of two rows in a computer data center.
Figure 6:
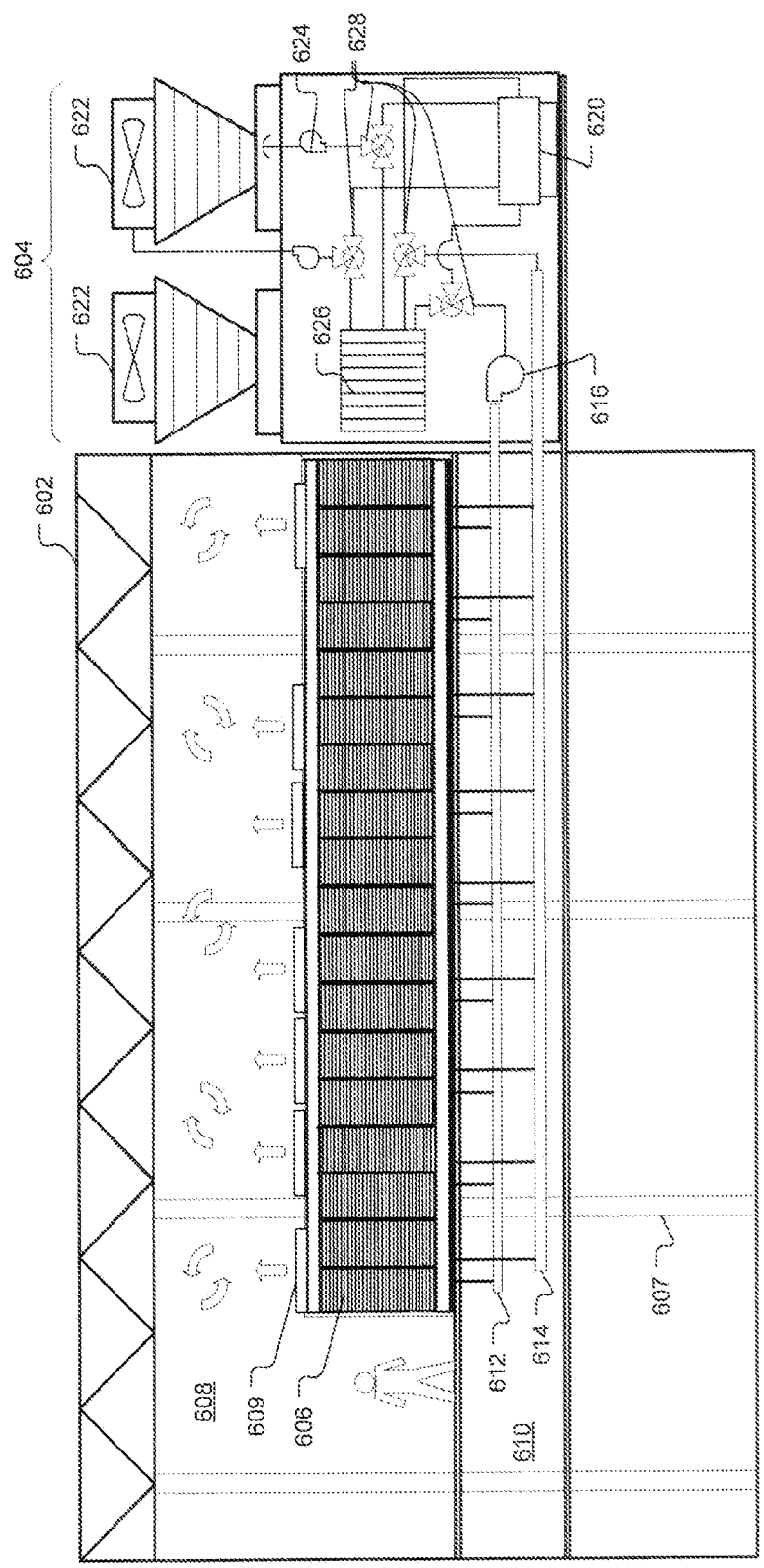
FIG. 6 shows a schematic side view of an example data center facility.

The area above the apparatus 100 is generally open to (or ducted to) a data center workspace's upper area when the apparatus 100 is installed, so that the fan set 120 blows air up into the upper area of the workspace (see FIGS. 4 and 6). In other implementations, air may be routed into a raised floor, into a space between computer racks, into a ceiling space, or may be routed in other manners also.

The components of housing 102 define a number of openings in the housing 102. For example, the side of the housing 102 toward which cooling coil 108a faces is substantially entirely open. As a result, air leaving the back edges of computer racks that are backed up to the apparatus 100 may readily flow into the warm air capture plenum 109 in front of cooling coil 108a. In a similar manner, air from racks on the opposed side of apparatus 100 may enter the warm air capture plenum 109 in front of cooling coil 108b.

In the example, the cooling coils 108a, 108b are arranged in a V-formation and sealed together at their bottom edges, and blanked off on their side edges. Such an arrangement acts to separate the warm air capture plenum 109 from the cool air plenum, and also positions the cooling coils 108a, 108b at an angle so that air flowing through the coils 108a, 108b begins moving in a direction upward toward fan set 120 after leaving the coils. A support 110 holds the coils 108a, 108b at their bottom midpoint to help prevent them from coming unattached, bending, or otherwise sagging. A frame 106 around the edges of the coils 108a, 108b provides additional rigidity to the coil assembly, and may be configured to be detached from the housing 102 so that the coils 108a, 108b may be conveniently removed if they require replacement.

As shown, a space exists beneath the coils 108a, 108b so that air in the warm air capture plenum 109 on one side of the apparatus 100 may flow to the other side of the apparatus 100. Such an arrangement may be beneficial, for example, to allow effective cooling of unbalanced loads (e.g., when the volumetric flow of warmed air from the racks adjacent the coil 108a is much greater or less than the volumetric flow of warmed air from the racks adjacent coil 108b). This arrangement may also be beneficial if one of the coils becomes plugged or stops circulating cooling water or other cooling agent. In such a situation, warm air from the less effective side of apparatus 100 may pass to the more effective side of apparatus 100 and be cooled there. As a result, such an arrangement may provide apparatus 100 with greater cooling flexibility, diversity, and redundancy. Other features providing additional flexibility, diversity, and redundancy to apparatus 100, whether used alone or as part of a system of multiple apparatuses, are described in more detail below.

Connector 116 may permit cooling water supply and return pipes or hoses to be connected to the cooling coils 108a, 108b. Connector 116 may take a variety of forms, such as a quick connect fitting, a screw-on fitting, or any other appropriate form of connection.

Access port 112 may be provided in a panel that forms a floor for the apparatus 100, or in a number of locations in the periphery of housing 102 where piping or other utilities need to enter housing 102. The access port 112 may be provided with brush seals or other forms of seals so that pressure differences between the warm air capture plenum 109 and the area below housing 102 do not cause substantial airflow into or out of the housing 102.

In the pictured implementation, the access port 112 is shown having its length at a substantial angle to the length of the apparatus 100, such as a 45 degree or 60 degree angle. Providing access port 112 at such an angle may aid in the provision of cooling piping or hoses to apparatus 100 when apparatus 100 is installed over a raised floor system. In particular, support beams immediately below the surface of the raised floor may need to be kept intact to provide adequate support for the raised floor tiles and the equipment that the tiles in turn support. The support beams generally run longitudinally with, or at a right angle to, equipment such as apparatus 100. If access port 112 was in line with such a support, and was located over such a support, piping might not be able to pass through the access port at any location without requiring a support beam to be altered. However, with the access port at a diagonal 112, an installer may generally move a pipe back and forth along the access port 112 until they find a location in which there is neither a longitudinal support member in the floor nor a lateral support member.

Where the apparatus 100 is to be mounted on a raised floor, it may also be dimensioned in its depth (i.e., its shorter dimension; here, from one side that meets with a rack to an opposed side) so as to be deeper than the space between support beams in the floor, so that it will not tend to break through the floor between support beams.

Various portions of the ends of apparatus 100, which in this example are at right angles to the sides of the apparatus 100 to which coils 108a, 108b face, may be left open or closed. In this example, blanking panels 113 are provided at the ends of apparatus 100 between coils 108a, 108b—where the cool air plenum is. In this manner, cool air is prevented from flowing laterally out of apparatus 100, and is effectively held in the zone between the fans set 120, cooling coils 108a, 108b, and blanking panels 113 at the ends of apparatus 100. This approach may simplify sealing during installation and may also simplify fan speed control after installation.

In contrast, passages may be provided for lateral movement of warm air approaching apparatus 100. For example, although blanking panel 114 may be installed on apparatus 100 initially to provide torsional rigidity during shipping, blanking panel 114 may be removed before or upon installation of apparatus 100. As a result, warm air that flows out of racks adjacent to apparatus 100 may flow into the side of apparatus 100, and then up through cooling coils 108a, 108b. In addition, pass-through 117 and other pass-throughs are provided near the coils 108a, 108b, so that additional warm air may move into each end of the apparatus 100. Arrows in FIG. 1A show examples of movement of air into and out of apparatus—both into the sides of the apparatus 100 (which would come from computer racks in front of the apparatus 100) and the ends of the apparatus 100 (which would come from spaces between apparatus in a row), and out the top of the apparatus 100.

As described in more detail below, flow of warm air laterally along a row of apparatuses may provide flexibility, diversity, and redundancy to a larger system. In particular, flexibility may be provided by permitting mismatching of apparatuses 100 with cooling loads such as computer racks. For example, cooling loads may be evenly spaced along a row, while apparatuses 100 may be unevenly spaced or may have a width that differs from that for units in the cooling loads. As a result, the apparatuses 100 may be moved laterally and spaced to meet the load.

In one example, apparatuses 100 may be spread out so as to economically cover a lowest rack power density (i.e., the apparatuses 100 would be spaced widely so as to provide only enough cooling for equipment that generates an expected minimum of heat). Then, if higher powered racks need to be cooled, the higher powered racks can be spaced apart from each other so that each rack is handled by multiple apparatuses 100 (instead of adding apparatuses 100). Blanking panels may be provided in the spaces between racks so that the apparatuses 100 in those locations do not capture ambient air from their sides, but instead draw warm air through their ends from the space between the apparatuses 100. In an extreme case of a very high-powered rack, where all of the heat from the rack cannot be handled by lateral motion of warm air up and down a row of apparatuses 100, the rack may be moved forward away from the faces of the apparatuses 100, and a duct collar may be provided between the rear of the rack and the fronts of the multiple apparatuses 100 associated with the rack.

For diversity and redundancy, if one apparatus 100 is not operating properly, and is thus not circulating enough air or cooling the air that it is circulating sufficiently, some of that air may pass from one apparatus to another, so that the other apparatus can support an additional part of the cooling load. In this manner, additional thermal capacity may be provided to a system to decrease the size of an effect that any particular failure in the system may have on the temperature of air in a data center.

Skid channel beams 104 may be provided at or near the bottom of apparatus 100 or at another appropriate location on apparatus 100, and may be positioned so that standard pallet jacks, forklifts, or other skid machinery may conveniently engage with and lift the apparatus 100. Such an arrangement may substantially reduce the amount of time needed to install a number of apparatuses in a new data center, may permit for rearrangement of apparatuses in an existing data center, and may permit easier shipping of apparatus 100. For example, a forklift may drive from the space inside a data center to a standard loading dock, enter a tractor-trailer at the loading dock to obtain an apparatus 100 inside the truck, insert tines into skid channel beams 104, lift the apparatus 100, back the apparatus 100 out of the truck, turn around, and conveniently position the apparatus 100 as needed in a row in the data center. The length of the apparatus may be chosen to assure that pallet jacks, forklifts, and similar equipment can be used to easily load and unload the apparatus from trucks and shipping containers. A length of less then 7'-6" may allow for such universal application, and up to 8' may be accommodated by certain U.S. trailers. A width of 6' or 7' may fit well within most transport containers and still provide substantial space for maneuvering.

Fan set 120 may provide a number of fans for circulating air through the apparatus 100 so that the air may be cooled and be returned to a data center workspace. In the example shown, six fans in two rows of three are provided for the apparatus 100. Each fan, such as fan 122, may be operated individually by a motor controller such as fan motor controller 124. Each combination of a fan 122 and motor controller 124 may be mounted on a fan tray 126. The fan tray 126 may be a removable unit that may be slid outward from the apparatus 100, such as when a fan motor burns out or a fan controller fails, and a new fan is required to replace it. Removal of a fan tray may occur without the need for tools, and electrical connections may be integrated with the tray, i.e., without the need for a cord. This arrangement also facilitates future capacity increases or efficiency improvements via replacement of individual fan trays. Locking mechanisms (not shown) may be provided with the fan trays 126, so that the fans seal properly when installed, and do not shake loose from the apparatus 100.

The fans may be operated to maintain a particular temperature, such as in the workspace, in the cool air plenum, or in the warm air capture plenum 109. Alternatively, the fans may be operated to maintain a particular pressure differential in the system. As one example, the fans may be operated to maintain substantially no pressure differential between a side of the housing 102, where air is received from the computer racks, and the workspace in a data center. Where such a near-zero pressure differential is maintained, any air-circulating equipment on the racks (such as fans associated with each tray in the racks) will operate as though it is working in an open room, because of the near-zero pressure difference. Such implementations may operate more efficiently than implementations in which circulating equipment must overcome a pressure differential.

Struts 128 may extend upward from apparatus 100 to support overhead equipment above apparatus 100. One such piece of equipment is cable rack 130 shown in FIGS. 1B and 1C. The cable rack 130 may be provided with cable trays to support data cabling along a length of computer racks in a data center. Such cabling may include, for example optical fiber, Cat 5 cable, and CX4 cable. Cable trays 132, 134, 136 are shown in this example to provide support for such cables. In general, as shown in FIG. 1C, the cable trays 132, 134, 136 may be arranged in-line with a longitudinal axis of the apparatus 100, so that cabling may be routed along rows of computer racks in the data center, and wire taps may be dropped downward to particular computers along each row. The cable trays may take familiar forms, such as intermittently-spaced bent wires, and the spacing between each wire may be dependent on support requirements and the expected rigidity of the cable to be placed in the particular cable tray, so that cable will not droop unnecessarily below any particular tray.

A cross support 138 may provide additional rigidity to the cable rack 130. Other supporting structures may also be provided as appropriate. Strut 129 may extend downward and may mate with strut 128 provided on apparatus 100. For example, strut 128 may be of the size and shape that is similar to an interior portion of strut 129, so that strut 129 may slide down and over strut 128. If a fixed length is acceptable, struts 128, 129 may be combined into a single continuous strut. Other similar struts may also be provided in a familiar manner to provide sufficient mounting points for cable rack 130.

The struts 128, 129 and associated racks may also support additional overhead loads. For example, such racks may support busways, receptacle strips, lighting, fire detection and suppression (e.g., sprinklers) and other components.

While the cooling coils 108a, 108b are shown for illustration in a V-formation in the figures, they may take other arrangements as well. For example, the cooling coils 108a, 108b may each be in a vertical position and may be at, or slightly behind an open face of the housing 102. In such an arrangement, the cooling coils 108a, 108b will be directly facing warmed air coming out of computer racks. The coils 108a, 108b may extend to the floor of housing 102 or a blanking panel may be provided to connect and seal the bottom area between bottom portions of cooling coil 108a and cooling coil 108b, so that air does not pass between the warm air capture plenum 109 and the cool air plenum without first passing through the coils 108a, 108b and being cooled.

Also, as described in more detail below in FIG. 2, the cooling coils 108a, 108b may be mounted horizontally, such as in the form of a single cooling coil 212 that faces the fans in fan set 202.

An anchor lip 118 is shown on a front face of apparatus 100 in FIGS. 1A and 1C. The anchor lip 118 may be provided at a height that is at an upper edge, lower end, or other location of the back portion of computer racks that are to be mounted to apparatus 100. The anchor lip 118 may provide one or more attachment points at which the computer racks may be connected to the apparatus 100. For example, various holes may be drilled in a surface of anchor lip 118, so that pins or other connecting mechanisms may be inserted through the holes to fixedly connect the computer racks to the apparatus 100. As a result, the apparatus 100 may provide an anchoring for the computer racks, such as in the event of an earthquake, so that the computer racks do not easily tip forward into a workspace. Other anchoring structures may also be provided as appropriate.

Apparatus 100 may be constructed of various appropriate materials. For example, framing members that support apparatus 100 may be in the form of extruded aluminum channels, I-beams, box beams, rolled or press-formed sheet metal, or angle members, among other arrangements. Various forms of iron, plastics, or other materials may also be used in the structural members and in other components of apparatus 100. In addition, sheet metal may be used to form components such as blanking panel 114, and may also be used to form other, structural components, such as framing members. The components of apparatus 100 may be joined in various manners such as by use of adhesives, welding, riveting, or other joining techniques, such as by the use of pop-riveted sheet metal.

In operation, as explained in more detail below, a number of apparatuses such as apparatus 100 may be installed in a row in a substantially straight line. Each apparatus 100 may be positioned so that its end, where blanking panel 114 is shown in the figures, faces an opposed end of the next adjacent apparatus. Adjacent apparatuses may abut with each other, or may have space between their ends. Such space, during operation, may serve as part of an extended warm air capture plenum 109 for an overall system, because air may flow to and from such a space through the area previously covered by blanking panel 114 (during shipping) and through pass through 117 and into the warm air capture plenum 109 of apparatus 100.

The sides of such an open area between apparatuses in a row may be separated from a workspace by computer racks that are placed in front of the apparatuses, including between individual apparatuses. The top of such an open area may be separated from a workspace via a top blanking panel (not shown). Such a blanking panel may, for example, take the form of a flexible pleated material that can accommodate different lengths for a space. The blanking panel may also take the form of a pair of metal sheets with fasteners attached to one sheet and grooves provided in the other sheet, so that the sheets may slide in and out relative to each other and then be fixed in position by tightening a connector such as a wing nut on the fastener. Where an above-ceiling space is used as a warm-air collection zone, the area may be ducted to such a space.

When the apparatuses are in position, computer racks may then be rolled in front of the racks in a substantially linear fashion to form a row of racks. Other computer racks may be rolled into position on the opposite side of the apparatuses to form another row of racks. The combination of the row of apparatuses sandwiched between the two rows of racks may itself form a row in the data center. Multiple such rows may be installed next to each other, with aisles between each of the rows providing workspace for technicians in the data center. In this manner, a relatively high density of computers and associated computer cooling may be provided in a data center in a relatively simple and flexible manner.

Figure 2:
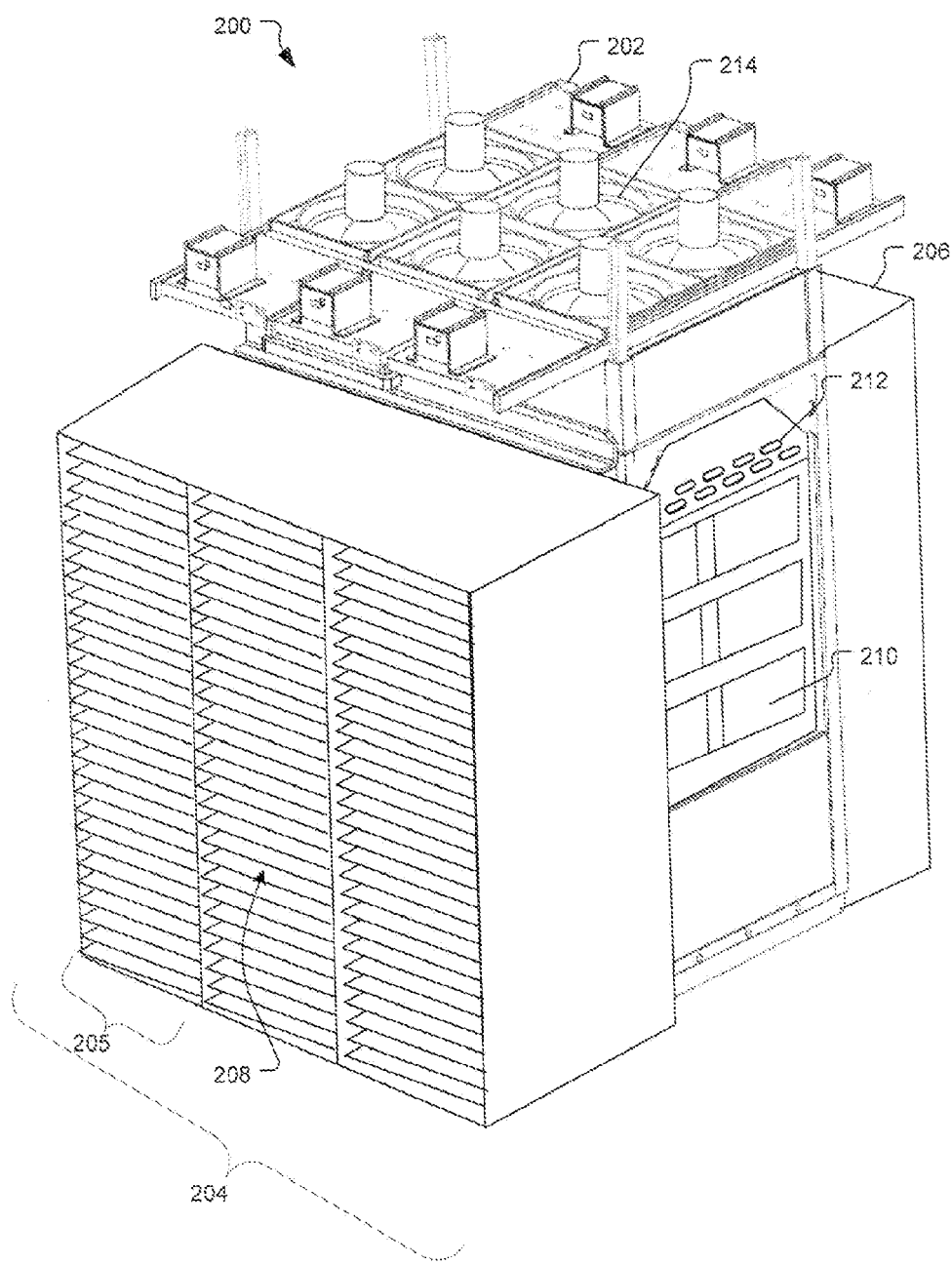
FIG. 2 shows a perspective view of a data center cooling apparatus providing cooling to a number of computer racks.

FIG. 2 shows a perspective view of a data center cooling apparatus 200 providing cooling to a number of computer racks 204, 206. In general, the apparatus 200 takes a form similar to the apparatus 100 shown in FIGS. 1A-1C. Here, however, the apparatus 200 is shown in combination with computer racks 204, 206 that may be used with the apparatus 200 and cooled by the apparatus 200. By way of example, the racks 204, 206 are shown as slightly wider than is the apparatus 200, with rack 204 sticking out beyond apparatus 200 at both ends, and rack 206 sitting flush with the near end of apparatus 200 (and thus sticking father past the far end of apparatus 200 (not shown)).

Each rack 204, 206 may be made up of three separate vertical bays, such as bay 205. The bays may be each connected so that the racks 204, 206 are single units that move together (e.g., on wheels (not shown)). Each bay may be approximately the width and depth of a computer motherboard, and may take a form much like that of a bakery or cafeteria rack, having supporting ledges on each side of a bay over which the motherboards may be slid and dropped into place like a tray in a bread rack. As a result, each motherboard (alone or in combination with other components) is simply referenced here as a tray, such as tray 208.

The trays in the bays may connect to a number of outside services such as data cabling and electrical power, which connections have been omitted here for clarity. For example, a data jack, such as an RJ-45 jack, may be provided along a front edge of each tray 208, and cabling may be brought down from a rack, such as cable rack 130 in FIG. 1B. In addition, a power supply and air circulation fan may be provided near the front or back of each tray or group of trays, and a power cord may run from the power supply to the front of each tray and may be plugged into a vertical power strip running down the front of each bay near the edge of each bay. Other cabling arrangements may also be used where appropriate.

Other arrangements of computer racks may also be provided. For example, motherboards may be provided in a vertical arrangement, where multiple motherboards are stacked side by side. In such an arrangement, the motherboards may also connect to a backplane in a manner commonly known as a blade server arrangement. Also, motherboards may be grouped into modular units, so that multiple motherboards may be provided to, or taken from, bay 205 at one time.

Various racks having substantial front-to-rear airflow may be cooled by apparatus 200, including various industry standard racks. Racks that require rear access for maintenance and other functions may also be accommodated, such as by moving them forward from the apparatus 200. A width of two feet, for instance, may be a practical minimum for serviceability, and three feet or four feet may provide additional room. In such a situation, the warm air may mix more with ambient air before it is capture than compared to an arrangement having with more intimate coupling. If mixing is excessive, doors or curtains or other mechanisms may be used to seal off the end of the service aisle and reduce mixing.

In this example also, a single horizontal cooling coil 212 is shown, as compared to the V-shaped arrangement of FIGS. 1A-1C. The coil 212 is located directly beneath air circulation fans such as fan 214 in a fan set 202. The fans may thus draw air directly upward through the coil 212 and blow the cool air upward into the ceiling space in a data center workspace. The coil 212 may have less surface area than would a pair of coils in a V-shaped arrangement, so that the velocity of air through the coil 212 may be higher, the coil may need to be deeper, and the pressure drop through the coil may be greater. As a result, the fans 202, such as fan 214, may need to be controlled to provide a higher pressure increase than if coil 212 were larger in surface area and shallower in depth. However, such an increased pressure drop through the coil 212 may be offset by a reduced pressure drop due to the elimination of the vertical channel between V-coils.

The coil 212 may be provided with structures by which the coil 212 may be rotated, or pivoted, downward so that the coil face moves toward one of the sides of apparatus 200. In such a position, a dolly, forklift, or other similar mechanism may be brought to the face of the apparatus 200 to lift the coil 212 out of the apparatus 200. In a similar manner, a new coil may be inserted to replace coil 212.

In addition, openings such as opening 210 may be provided in opposed sides of apparatus 212 in a manners similar to that described above, so that warm air may pass freely into one apparatus from the area adjacent the apparatus, where the apparatuses are installed in rows.

In some implementations, networking gear may be provided on top of racks 204, 206, or at the end of a row of racks or apparatuses. The pass-throughs or openings at the end of an apparatus that is last in a row of apparatuses may also be left open to draw air in from a workspace. Where gear such as networking gear is located near such an opening, air may be drawn past such gear to provide cooling to the gear. The networking gear may also be mounted to an apparatus 200 in a manner similar to other computer racks (e.g., so that air is drawn across a rack of networking gear and into apparatus 200).

With networking gear placed high, user may have difficulty seeing indicators (e.g., LED's) on the gear, both because the LED's are not aligned with their line of sight, and because wires extending from the gear may block the view. Thus, tip-up, pivoting brackets may be provided (not shown) on which the network gear may be mounted so that the gear may have its back end lifted, and may thus be angled downward toward a service aisle. The bracket may have locking stops so as to permit mounting of the networking gear in a raised position for operation and a lowered position for transport.

With the networking gear raised, the system may achieve one or more advantages. For example, angling of the gear may allow a user in a service aisle to readily see operation LEDs on the gear, both because the LED's will be aligned with the angle of view of the user and because the networking cables (often extending from the front of the gear just below the LEDs) will be angled downward and thus will not block the view of the LEDs. Also, where cable lengths are limited (such as because of codes or because cable lengths are a factor in limiting computer performance), angling of the gear may permit the use of shorter cables.

Figure 3A:
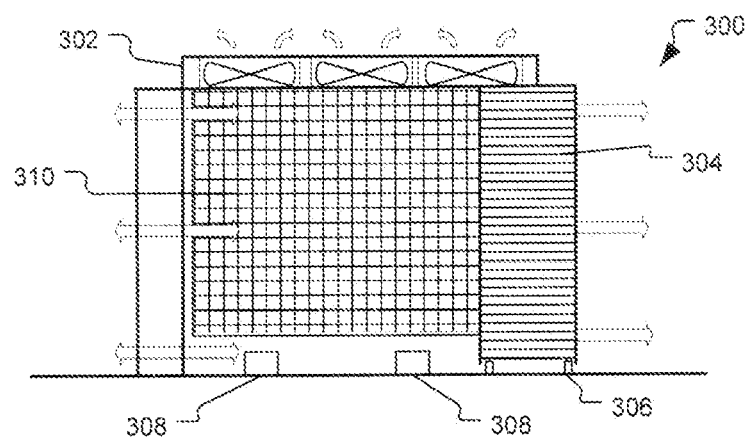
FIG. 3A shows a front view of a data center cooling apparatus with a single computer rack.
Figure 3B:
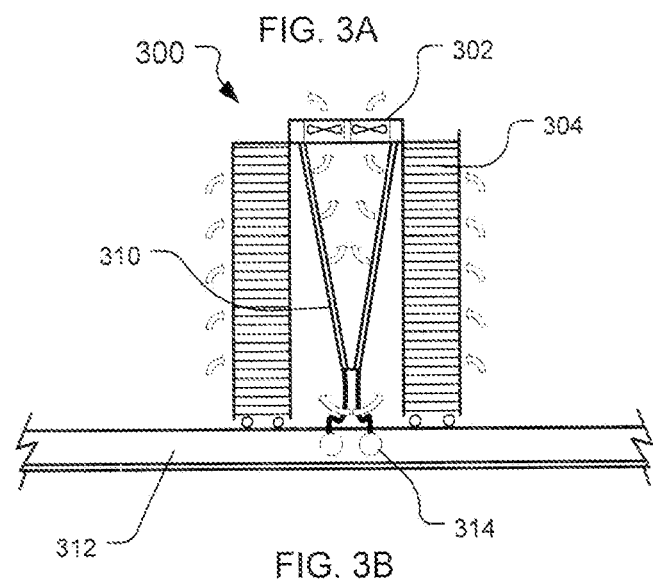
FIG. 3B shows a data center cooling apparatus with a pair of back-to-back computer racks.

FIG. 3A shows a front view of a data center cooling apparatus with a single computer rack 304. In general, this figure shows a computer rack 304 positioned in front of a modular cooling apparatus 302, to form an air circulation system 300. In this example, the rack 304 is a single bay rather than a three-bay assembly as in the earlier figures. The other two bays have been left out to provide a clearer view of the apparatus 302 relative to the rack 304. FIG. 3B shows a side view of the same apparatus, with another computer rack on a back side of the apparatus 302, to form a back-to-back configuration.

The rack 304 is provided with caster wheels 306 (or another type of roller) so that it may be easily manipulated by a technician in a data center, and positioned in front of the apparatus 302. Locking structures or other joining mechanisms may hold the rack 304 in place and may, in appropriate circumstances, seal the rack to the apparatus 302 to prevent air leaks. However, where fans in the apparatus 302 are controlled to maintain a nearly zero pressure differential between the workspace and the area at the front of the apparatus 302, there is less need for such sealing because of the lack of a pressure differential between a warm air capture plenum in the apparatus 302 and the workspace.

The face of apparatus 302, near its left side, is visible in FIG. 3A because no racks have yet been positioned there. This view shows a front surface of a coil 310, which may be a surface like one sees when looking at the front of a car radiator. In this example, the surface area may be relatively large, such as on the order of 6 feet wide by 5 feet high. The coils may be sized in an appropriate manner to provide cooling to offset the heat generated by computers in a rack 304 and in other racks corresponding to apparatus 302. Also, a space may be provided beneath the coils to prevent air to pass from one side of the apparatus 302 to the other. As shown by the flow arrows, air may also be allowed to pass in and out of ends of the apparatus 302.

In one example, apparatus 302 may support six or more bays in a pair of racks, as may be seen in FIG. 4 and the accompanying description. Each bay may, in turn, host on the order of 20 to 40 trays, which may each include one or more microprocessors and associated electronics, and a power supply. Certain of the trays may be dedicated to processing, while other trays may be dedicated wholly or in part to storage or networking, and may host a number of hard drives or other storage mechanisms, which generally generate less heat than do microprocessors.

FIG. 3A also shows lifting structures in the form of skid channels 308 under the apparatus 302. As explained above, such structures may provide for convenient transport, movement, positioning, and repositioning of the apparatus 302 by standard processes and with standard equipment. Other lifting structures such as overhead hooks may also be employed. The ends of apparatus 302 are also shown as being open, as described above and as indicated by air flow arrows pointing left and right in FIG. 3A along the length of apparatus 302, to permit for apparatus-to-apparatus flow of warm air.

As shown in FIG. 3B, a back-to-back arrangement is provided, and a V-shaped coil 310 arrangement is also provided. From this angle, a raised floor is shown as defining a sub-space 312 below the data center. The sub-space 312 may hold, for example, coolant (e.g., water or refrigerant) supply and return piping 314. Connections tapping off of such piping may extend up through the floor and into the apparatus 302.

In another arrangement, the raised floor may be eliminated, and the piping 314 may run lengthwise inside the apparatus 302. Such piping may be moved into place after a row or part of a row of such apparatuses are moved into place (e.g., by sliding it down the row and into the housings). Alternatively, each apparatus may have its own length of supply piping and a length of return piping that each terminate near an end of the apparatus housing. Piping segments for adjacent apparatuses may then be connected using short flexible connectors. Or where such apparatuses are separated by a space, the connection may be made by a length of standard piping inserted between the adjacent apparatuses (perhaps with flexible connections at each end).

Figure 3C:
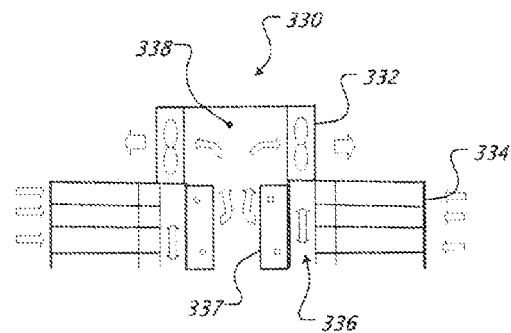
FIG. 3C shows a side view of a pair of racks having standoffs at their back edges.

FIG. 3C shows a side view 330 of a pair of racks having stand-offs at their back edges. In general, this figure shows that the racks may extend farther backward than do the motherboards and other associated items in the rack that block air from flowing up and down. In this manner, a space may be maintained or provided for behind the exhaust point for each tray, so that air may move relatively freely from area to area behind the trays, even if the racks are pushed flat up against a coil having a vertical face that effectively seals against the back surface of the rack. As a result, hot exiting air may spread out some before passing through the coil so that more of the surface area of the coil is used for cooling. Also, air may move up and down or side-to-side to provide better diversity in a system, in case certain areas are presenting a higher heat load than are others, or certain areas have less capacity (such as if coils in those areas are defective or broken) than do others. Also, by permitting spreading of the air, the coil 337 may use much more of its cooling surface area, and not just the area that is directly targeted by fans.

As shown in the example from the figure, a rack 334 holding a number of removable trays is positioned back-to-back with another rack. Vertical coil 337 is positioned against the back edge of the rack 334. Because the rack 334 is deeper than are the trays inserted into the rack, a space 336 is defined up and down the rack 334 behind the trays. For example, the back edge of the trays may hold a number of circulation fans and/or power supplies through which warmed air is ejected from the trays. Air is drawn by fan 332 through coil 337 into cool air plenum 338. In this example, the coil 337 is shown as a vertical coil covering part of the back of the rack, and pressed flat against the back of the rack; other arrangements for the coil may also be used, however. For example, the coil may be placed above the top levels of the racks and the racks may be pressed back-to-back against each other, with lateral and up-and-down airflow entirely in the stand-off areas. In one example, the coils may be arranged as an inverted V, immediately over the warm air plenum that is formed between the opposed back edges of the trays in the racks.

The separation, or stand-off, may be implemented in a variety of manners. For example, the frame of the rack may be arranged to be deeper than are the various trays placed in the rack; the sides of the frames may also be left open so as to permit lateral air flow even when frames are pressed back-to-back against each other. Likewise, the frame may have substantially the same depth as the trays, and extensions may be affixed to the rack and stick out backward from the rack to act as a standoff. Other mechanisms for ensuring some spacing or a particular extent of spacing, may also be used.

Figure 3D:
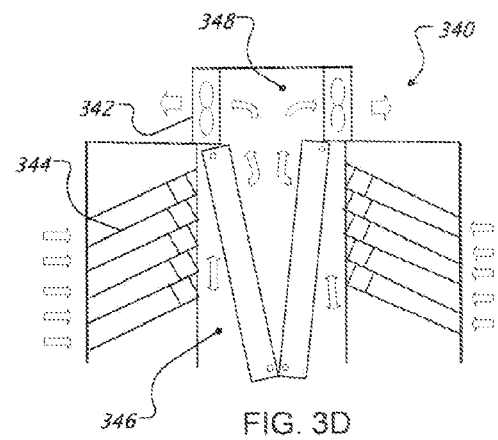
FIG. 3D shows a side view of a pair of racks having slanted trays.

FIG. 3D shows a side view 340 of a pair of racks having slanted trays. One example is tray 344, which is arranged as part of an array of trays in a vertical stack, similar to the other examples discussed above. Also, the tray 344 has a power supply and circulation fan at its back edge. In this example, however, the tray 344, like the other trays, is substantially higher at its back end than at its front end. In operation, circulating air is thus drawn in the front of the rack holding tray 344 and other trays, and into warm air plenum 346 behind the trays. The air is then drawn through cooling coils by fan 342 and into cool air plenum 348, where it is then circulated back into the workspace. The area at the front of a rack above the highest tray may be covered by a blanking panel or other structure to prevent air flow at such a location.

The fans and/or power supply associated with tray 344 may be mounted with the tray 344 or separately. Thus, for example, the axis of the fan may be co-axial with the direction of airflow up the tray 344 (i.e., the fan may be slanted with the tray 344), or the fan may be positioned horizontally, vertically, or in another orientation that differs from the angle of the tray 344.

Because the air is warmed by electronic components on the tray 344 as it passes over the tray 344, it tends to rise naturally from the front of the tray 344 toward the back. Such natural motion may create or supplement the air circulation across the tray 344. In certain implementations, mechanical circulating systems such as fans may be removed from the back edges of the trays so that the back edges are partially or wholly open, and the natural convection of the warmed air may push the air out the back of the trays even in the absence of substantial mechanical assistance. Such natural circulation may increase air circulation during normal operation and may also permit certain circulation so as to permit limited operation even when mechanical systems fails, or to act as sufficient total circulation for trays carrying components having a low heat load. Also, although mounting of the racks at a substantial angle, such as more than 20 degrees, more than 30 degrees, or more than 40 degrees from the horizontal, can create potentially wasteful dead space (see the open triangular area above rack 344), such space is not wasted in this context because the top trays can take up space above a worker's reach because the worker need only reach the front, lowest part of the top tray for maintenance purposes.

Figure 3E:
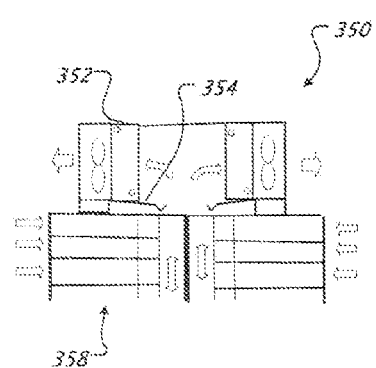
FIG. 3E shows a side view of a pair of racks of computers having coils mounted above the racks.

FIG. 3E shows a side view 350 of a pair of racks of computers having coils mounted above the racks. In general, this implementation differs from others described in this document in that the cooling coil here is mounted above the racks rather than below or behind them. Placement of cooling coils above a rack may typically be discouraged because such an arrangement places water-filled components above electrical devices that could short out if hit by water. However, in this implementation, shields 354 are provided below the coils 352 to catch any leaking water and to channel it away from the computers 358, such as laterally (as viewing the racks from their front, open edges) and then against an end wall of a row of racks, to a downpipe, or to another fluid collection mechanism.

The shields 354 may be sloped slightly from the horizontal from front to back to direct fluid back so that it is no longer over any trays, and from side-to-side to direct fluid to one of their sides, such as a side that is not over the computers 358, and may also be provided with a deepened channel that can carry additional fluid without flowing over an edge of the shields 354. For example, where the shields are made from sheet metal or a similar material, gutters may be formed along an edge by crimping the metal along a line.

The shields 354 may be arranged and configured in a variety of manners so as to lessen the chance that water may splash or otherwise reach the computers 358. For example, multiple angles may be crimped into the shield 354 so as to lessen upward splashing when water hits the shield 354. Also, the top surface of the shield may be perforated, or a screen, foam pad, or similar structure may be laid over the shield 354 to lessen any splashing. Also, other portions of the racks may be likewise configured to prevent dripping or splashing. For example, frame members of a rack may have their edges curled or crimped backward so as to catch water that would otherwise drip off the edges and perhaps onto a motherboard. Such frame members may then have drain holes provided at appropriate locations along their lengths so as to permit caught water to drain downward.

Placement of coils over the level of racks may provide a number of benefits. For example, by moving coils out of the space between racks, the racks may generally be moved closer together because the space for vertical airflow in the warm air plenum is substantially unimpeded. For example, the racks of FIG. 3E are shown as touching back-to-back (with a stand-off between the back of each motherboard and the back of each rack, to permit for up and down airflow), while the racks in the other figures show a greater spacing.

The particular reduction in spacing will, of course, depend on the particular levels of airflow needed to cool the system. As a result, additional floor space may be recovered in a facility with a coil-on-top arrangement.

In addition, placing coils above rather than below the rack may allow additional computers to be installed up and down a rack and still be within acceptable reach of a technician. For instance, if a cooling module is two feet off the ground (that is, the coil portion of the cooling module, as shown in FIGS. 1A and 1C), and computers are only installed inline with the coil portion, removing the module from the bottom of a rack may enable a system to have two additional feet of computers in every rack, and to thus use several additional computers in every rack. Generally, coils do not fail as often as computers do, so having coils in an out-of-reach area is less troublesome than having computers in such an area. Moreover, the coils in this arrangement may be mounted to long-term infrastructure, such as scaffolding that sits behind or between particular racks. As a result, the racks may be readily moved into position.

In a similar arrangement a wall may be supplied at a back wall of the warm-air plenum for each opposed rack, and/or the coil and fan arrangement may be integrated to move with the rack. In such an arrangement, the computer rack and the cooling and ventilation system would be part of a single assembly. The back panel may be used to create a single warm air plenum for a rack or adjacent racks (with airflow permitted laterally between adjacent racks) in a single row (e.g., for use when a row of racks backs up to a wall) or the back panel may be omitted to create a common warm air plenum for back-to-back rows of racks.

Also, the coil may be placed on the top of the rack or the bottom of the rack in such an integrated implementation. When placed on top, the coil may be positioned horizontally, with air flowing through it vertically, and the fans may be placed on top of the coil blowing up. When placed on the bottom, a right angle plenum may be used to route air under the rack and through a vertically mounted coil (having horizontal airflow) and fan.

Figure 3F:
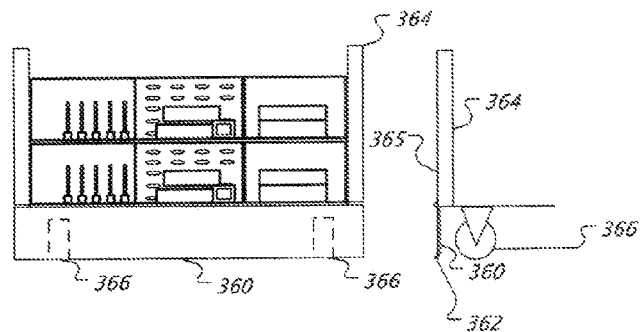
FIG. 3F shows an area at the bottom of an example movable computer rack.

FIG. 3F shows an area at the bottom of an example movable computer rack. Here, a skirt 360 is shown at the bottom of the rack to help prevent airflow from short-circuiting from the ambient workspace to the warm air plenum behind the rack. Generally, the skirt is a long flat object, such as a strip of sheet metal or plastic. The skirt 360 is arranged so that its bottom edge is about the same height as the bottom of wheels 366, on which the rack is moved. The skirt 360 may be mounted to the rack frame 364 by hinges 365 that permit the skirt 360 to move from a position pointing upward, in which it does not seal the bottom of the rack to a position pointing downward in which it does make such a seal. In addition, the skirt 360 may have a lip 362 that is at the lower edge of the skirt 360, and may further provide an improved seal by being somewhat flexible. For example, the lip 362 may be made of a thin strip of rubber (like a squeegee), a strip of foam rubber (like weather-stripping), a piece of thin and flexible plastic or metal, or brush-like material, to name just a few examples.

In operation, the skirt 360 may initially be rotated into an upward position, and held to the frame 364 by clips or by some other appropriate mechanism. In such a position, the rack can be moved easily around, and the skirt 60 will not impede such motion because it is folded up against the rack. Once the rack is moved into place, the skirt 360 may be folded down into position, such as by a technician releasing a latch with his or her toe and then moving the skirt down against the ground or Various mechanisms may also be provided to prevent damage to the skirt 60. For example, a linking mechanism may be connected between the skirt 360 and a braking mechanism on the wheels 366, or the skirt 360 may rub up against the wheels when it is folded down so as to create a different form of braking condition.

FIG. 4 shows a plan view of two rows 402, 406 in a computer data center. In general, this figure illustrates certain levels of density and flexibility that may be achieved with structures like those discussed above. Each of the rows 402, 406 is made up of a row of cooling modules 412 sandwiched by two rows of computing racks 411, 413. In some implementations (not shown), a row may also be provided with a single row of computer racks, such as by pushing the cooling modules up against a wall of a data center, providing blanking panels all across one side of a cooling module row, or by providing cooling modules that only have openings on one side.

This figure also shows a component—network device 410—that was not shown in prior figures. Network device 410 may be, for example, a network switch into which each of the trays in a rack plugs, and which then in turn communicates with a central network system. For example, the network device may have 20 or data more ports operating at 100 Mbps or 1000 Mbps, and may have an uplink port operating at 1000 Mbps or 10 Gbps, or another appropriate network speed. The network device 410 may be mounted, for example, on top of the rack, and may slide into place under the outwardly extending portions of a fan tray such as fan tray 126 in FIG. 1A. Other ancillary equipment for supporting the computer racks may also be provided in the same or a similar location, or may be provided on one of the trays in the rack itself.

Each of the rows of computer racks and rows of cooling units in each of rows 402, 406 may have a certain unit density. In particular, a certain number of such computing or cooling units may repeat over a certain length of a row such as over 100 feet. Or, expressed in another way, each of the units may repeat once every X feet in a row.

In this example, each of the rows is approximately 40 feet long. Each of the three-bay racks is approximately six feet long. And each of the cooling units is slightly longer than each of the racks. Thus, for example, if each rack were exactly six feet long and all of the racks were adjoining, the rack units would repeat every six feet. As a result, the racks could be said to have a six-foot "pitch."

As can be seen, the pitch for the cooling module rows is different in row 402 than in row 406. Row 412 in row 402 contains five cooling modules, while the corresponding row of cooling modules in row 406 contains six cooling modules. Thus, if one assumes that the total length of each row is 42 feet, then the pitch of cooling modules in row 406 would be 7 feet (42/6) and the pitch of cooling modules in row 402 would be 8.4 feet (42/5).

The pitch of the cooling modules and of the computer racks may differ (and the respective lengths of the two kinds of apparatuses may differ) because warm air is able to flow up and down rows such as row 412. Thus, for example, a bay or rack may exhaust warm air in an area in which there is no cooling module to receive it. But that warm air may be drawn laterally down the row and into an adjacent module, where it is cooled and circulated back into the work space, such as aisle 404.

With all other things being equal, row 402 would receive less cooling than would row 406. However, it is possible that row 402 needs less cooling, so that the particular number of cooling modules in each row has been calculated to match the expected cooling requirements. For example, row 402 may be outfitted with trays holding new, low-power microprocessors; row 402 may contain more storage trays (which are generally lower power than processor trays) and fewer processor trays; or row 402 may generally be assigned less computationally intensive work than is row 406.

In addition, the two rows 402, 406 may both have had an equal number of cooling modules at one time, but then an operator of the data center may have determined that row 402 did not need as many modules to operate effectively. As a result, the operator may have removed one of the modules so that it could be used elsewhere.

The particular density of cooling modules that is required may be computed by first computing the heat output of computer racks on both sides of an entire row. The amount of cooling provided by one cooling module may be known, and may be divided into the total computed heat load and rounded up to get the number of required cooling units. Those units may then be spaced along a row so as to be as equally spaced as practical, or to match the location of the heat load as closely as practical, such as where certain computer racks in the row generate more heat than do others. Also, as explained in more detail below, the row of cooling units may be aligned with rows of support columns in a facility, and the units may be spaced along the row so as to avoid hitting any columns.

Where there is space between cooling modules, a blanking panel 420 may be used to block the space so that air from the warm air capture plenum does not escape upward into the work space. The panel 420 may simply take the form of a paired set of sheet metal sheets that slide relative to each other along slots 418 in one of the sheets, and can be fixed in location by tightening a connector onto the slots.

FIG. 4 also shows a rack 424 being removed for maintenance or replacement. The rack 424 may be mounted on caster wheels so that one of technicians 422 could pull it forward into aisle 404 and then roll it away. In the figure, a blanking panel 416 has been placed over an opening left by the removal of rack 424 to prevent air from the work space from being pulled into the warm air capture plenum, or to prevent warm air from the plenum from mixing into the work space. The blanking panel 416 may be a solid panel, a flexible sheet, or may take any other appropriate form.

In one implementation, a space may be laid out with cooling units mounted side-to-side for maximum density, but half of the units may be omitted upon installation (e.g., so that there is 50% coverage). Such an arrangement may adequately match the cooling unit capacity (e.g., about four racks per unit, where the racks are approximately the same length as the cooling units and mounted back-to-back on the cooling units) to the heat load of the racks. Where higher powered racks are used, the cooling units may be moved closer to each other to adapt for the higher heat load (e.g., if rack spacing is limited by maximum cable lengths), or the racks may be spaced from each other sufficiently so that the cooling units do not need to be moved. In this way, flexibility may be achieved by altering the rack pitch or by altering the cooling unit pitch.

Figure 5A:
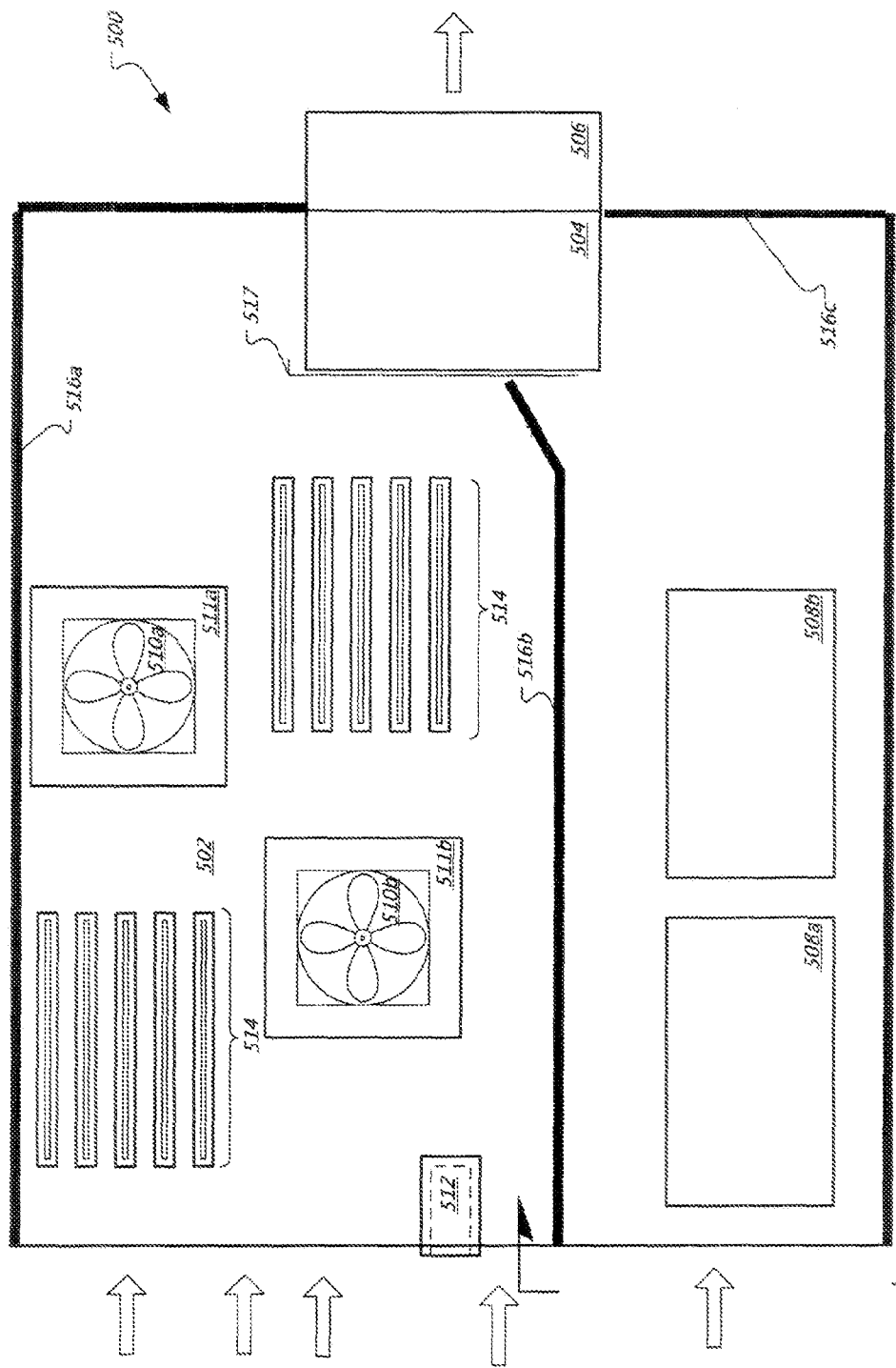
FIG. 5A shows a plan view of a tray in a rack-mount computer system, having dual-zone adjustable ventilation.

FIG. 5A shows a plan view of a tray 500 in a rack-mount computer system, having dual-zone adjustable power supply ventilation. The tray 500 may include a motherboard 502, which may itself be placed on a shelf in a rack, or may be placed in a carrier that is in the form of a tray, such as a thin, flat, relatively inflexible sheet that may or may not include sidewalls. The carrier may then be placed on a shelf. The term "tray" is not limited to any particular arrangement, but instead includes any arrangement of computer-related components coupled together to serve a particular purpose, such as on a motherboard. Trays may be generally mounted parallel to other trays in a horizontal or vertical stack, so as to permit denser packing than would otherwise be possible with computers having free-standing housings and other components. Trays may be implemented in particular configurations, including as computer servers, switches (e.g., electrical and optical), routers, drives or groups of drives, and other computing-related devices. In general, the trays in a system take a standardized physical and electrical form to be easily interchangeable from one location in the system to another, but the trays may take other appropriate forms.

The board 502 may be arranged so that air enters at its front edge (to the left in the figure), is routed over a number of heat-generating components on the board 502, and is drawn through a power supply 504 and fan 506 before being exhausted from the tray 500. The fan 506 may also be arranged to push air through the power supply 504. In addition, the fan 506 may be located in other positions relative at other positions along the back edge of the tray and at locations away from a back edge of the tray 500. The fan 506 and/or power supply 504 may be mounted on the board 502 or elsewhere on the tray 500, or may be mounted in another appropriate location, including with a battery for providing back-up power to the tray 500.

In the pictured arrangement, the heat from power supply 504 may be picked up after the heat from other components on the board 502 is picked up by the air flow. The speed of fan 506 may be controlled to maintain a set temperature for the air exiting the board 502, or for temperatures at other points on the tray 500. For example, a thermocouple or other sort of temperature sensor may be placed in the air flow, such as upstream of the power supply 504 or downstream of the fan 506, and the fan speed may be modulated to maintain a set temperature. The temperature of the exiting air may also be highly elevated compared to systems that do not control airflow in this manner. It may be more efficient to cool this air than it would be to cool air that does not have such an elevated temperature.

Air may be routed over board 502 by walls 516a, 516b, 516c. Wall 516a may block one side of board 502, and may funnel air toward openings in power supply 504. Where the walls 516a, 516c do not taper, the air may otherwise be directed to the fan 506. Wall 516c may block one side of board 502, so as to prevent air from moving directly from the workspace into an area behind tray 500 (i.e., to the right in the figure). For example, a plenum may be provided behind multiple boards in the form of an open wall into which the boards may be placed, or in the form of a wall having multiple openings into which fans may be slid. In certain implementations, fully blocking or sealing of such a plenum may not be necessary, such as when the pressure difference between the plenum and the workspace is minimal.

Wall 516b separates one portion of tray 500 from another. In particular, wall 516b may separate the portion of tray 500 containing heat generating components, such as microprocessors 511a, 511b, from components that generate substantially less heat, such as hard drives 508a, 508b. In making such a separation, wall 516b substantially blocks airflow over the components that generate less heat, and increases airflow over the heat generating components. In addition, wall 516b is arranged to route airflow into openings in power supply 504. Here, the wall 516b is positioned to direct a certain amount of ventilating air from each side of wall 516b. The wall 516b may be positioned on tray 502 at an appropriate position, and its terminal end may be made adjustable through pivoting or other mechanisms, so as to permit on-site adjustment of air flow.

In addition, gate 517 may be provided over a front surface of power supply 504 to provide adjustment to the size of openings on the front surface via openings in the gate 517 that form an interference pattern with openings on power supply 517 (much like the openings on certain spice containers). The interference pattern may be different for each side of tray 502, so that moving the gate 517 causes a greater effect on the airflow for one side of tray 502 than its does for the other side of tray 502.

Temperature-dependent mechanisms may also be provided to control the flow of air through power supply 504. For example, polymer or metallic materials that change shape with temperature may be used to form openings that close as their temperature falls—thereby driving back up the exit temperature of air from a particular portion of tray 502. As one example, the materials may produce a form of stoma that opens and closes. Also, mechanisms such as temperature-controlled louvers, or a temperature-controlled actuator on gate 517 may be used to control airflow over board 502. Such air control mechanisms may also be located off of tray 502. For example, a wall perforated by temperature dependent stoma may be placed behind a number of racks filled with trays, and may thereby control the exit temperature for all of the racks in a convenient manner. In such a situation, as in others discussed herein, fan 506 may be eliminated from tray 502, and a central ventilation system may pull air through the various trays and racks.

Board 502 may hold a variety of components needed in a computer system. As shown, board 502 holds a dual processor computer system that uses processor 511a and processor 511b connected to a bank of memory 514. The memory 514 may be in the form, for example, of a number of single in-line memory modules (SIMMs), dual in-line memory module (DIMMs), or other appropriate form. Other components of the computer system, such as chip sets and other chips, have been omitted for clarity in the figure, and may be selected and arranged in any appropriate manner.

Board 502 may also be provided with connections to other devices. Network jack 512, such as in the form of an RJ-45 jack or an optical networking connection, may provide a network connection for tray 500. Other connections may also be provided, such as other optical networking connections, video output connections, and input connections such as keyboard or pointing device connections (not shown).

Impingement fans 510a, 510b may be mounted above each microprocessor 511a, 511b, to blow air downward on the microprocessors 511a, 511b. In this manner, impingement fans 510a, 510b may reduce boundary layer effects that may otherwise create additional heat buildup on microprocessors 511a, 511b. As a result, lateral airflow across tray 500 can be reduced even further, while still adequately controlling the temperature rise to the microprocessors 511a, 511b.

Other heat relief mechanisms may also, or alternatively, be provided for microprocessors 511a, 511b. For example, one or more heat sinks may be provided, such as in the form of certain finned, thermally conductive structures. The heat sinks may be directly connected to microprocessors 511a, 511b, or may be located to the sides of microprocessors 511a, 511b, and may be attached by heat pipes to plates mounted to the top of microprocessors 511a, 511b. Thermally conductive grease or paste may be provided between the tops of microprocessors 511a, 511b, and any heat sinks to improve heat flow out of microprocessors 511a, 511b.

In operation, tray 500 may be mounted flat horizontally in a server rack such as by sliding tray 500 into the rack from the rack front, and over a pair of rails in the rack on opposed sides of the tray 500—much like sliding a lunch tray into a cafeteria rack, or a tray into a bread rack. Tray 500 may alternatively be mounted vertically, such as in a bank of trays mounted at one level in a rack. The front of the rack may be kept open to permit easy access to, and replacement of, trays and to permit for air to flow over the tray 500 from a workspace where technicians or other professionals operating a data center may be located. In this context, the term workspace is intended to refer to areas in which technicians or others may normally be located to work on computers in a data center.

As shown in FIG. 3D and described above, the tray 500 may also be accessed from the front and slid up an incline into position. Such an arrangement may assist in urging air to flow up the tray 500 and to thus draw more air into the tray. Such natural heat flow may be particularly valuable when there is a system failure such as a failure of a fan or fans. In addition, such angling of trays may, in certain implementations, have a benefit of reducing noise that propagates from fans into the workspace.

After sliding a tray 500 into a rack, a technician may connect a tray to appropriate services, such as a power supply connection, battery back-up, and a network connection. The tray 500 may then be activated, or booted up, and may be communicated with by other components in the system.

Although tray 500 is shown in the figures to include a multi-processor computer system, other arrangements may be appropriate for other trays. For example, tray 500 may include only hard drives and associated circuitry if the purpose of the tray is for storage. Also, tray 500 may be provided with expansion cards such as by use of a riser module mounted transversely to the board 502. Although particular forms of tray 500 may be provided, certain advantages may be achieved in appropriate circumstances by the use of common trays across a rack or multiple racks. In particular, great efficiencies may be gained by standardizing on one or a small handful of trays so as to make interaction of technicians with the trays more predictable, and to lower the need to track and store many different kinds of trays.

As discussed above, a data center may be made up of numerous trays (hundreds or thousands), each mounted in one of numerous racks. For example, several dozen trays may be mounted in a single rack within a space, with approximately several inches between each tray. Trays may also be packaged in groups. For example, two stacked trays may be matched as a pair, with one fan 506 serving both trays (not shown). Specifically, the fan 506 may be approximately double the diameter and height of a single tray unit, and may extend from the lower tray in a pair up to the top of the upper tray in a pair. By such an arrangement, the slowest turning portions of the fan, in the fan center, will be near the board of the top tray, where less airflow will normally occur because of boundary layer effects. The larger and faster moving portions of the fan 501 will be located nearer to the free areas of each tray 500 so as to more efficiently move air over the trays and through the respective power supplies more freely. In addition, a double-height fan may be able to move more air than can a single-height fan, at lower rotation speeds. As a result, a fan in such an arrangement may produce less noise, or noise at a more tolerable frequency, than could a smaller fan. Parallel fans may also be used to increase flow, and serial fans may be used to increase pressure, where appropriate.

Fan 506 may be controlled to maintain a constant temperature for air exiting fan 506 or at another point. By locating fan 506 downstream of power supply 504, and power supply 504 downstream of the other components of tray 500, the arrangement may maximize the heat rise across tray 500, while still maintaining adequately low temperatures for heat-sensitive components mounted to board 502, such as microprocessors 511a, 511b. Also, the power supply 504 may be less sensitive to higher temperatures than are other components, and so may be best located at the end of the air flow, where the temperatures are highest.

Although many applications seek to substantially increase airflow across heat generating components so as to increase the rate of heat dissipation from the components, the arrangement pictured here can allow airflow across tray 500 to be slowed substantially to increase the temperature rise across tray 500. Increasing the temperature rise decreases the mass flow rate, and can make cooling across the entire system more efficient.

In particular, when the temperature of the warm exiting air is increased, the difference in temperature between the warm air and any cooling water entering a cooling coil to cool the warm air, also increases. The ease of heat transfer is generally directly proportional to this difference in temperature. Also, when the difference in temperature is relatively small, increasing the difference by only one or two degrees can produce a substantial increase in the amount of heat exchange between the warm air and the cooling water. As a result, a system run at higher exhaust temperatures from board 502 can provide substantial advantages in efficiency, and lower energy consumption.

In certain embodiments, the temperature rise across tray 500 may be approximately 20° C. As one example, air may enter the space above board 502 from a workspace at 25° C., and may exit fan 506 at 45° C. The entering temperature may also be about 21-30° C. (70-86° F.), and the exiting temperature 40-50° C. (104-122° F.). The 45° C. exhaust temperature or other temperature may be selected as a maximum temperature for which the components in tray 500 can be maintained without significant errors or breakdowns, or a safe temperature of operation. The 25° C. entering temperature or other temperature may be a temperature determined to create a comfortable or tolerable temperature in the workspace in a data center. The entering temperature may also be linked to a maximum allowable temperature, such as a federal or state OSHA-mandated maximum temperature. The entering temperature could be approximately 40° C., which matches certain limits established by bodies governing workplace safety.

In other implementations, air may enter the space above board 502 at a temperature of 50° C., where appropriate thermal removal mechanisms or methods are provided for the components on board 502. For example, conductive and liquid-cooled components may be placed in contact with microprocessors 511a, 511b to increase the rate of heat dissipation from those components. Where a higher input temperature is selected, the temperature difference across tray 500 will generally be lower than if a lower input temperature is selected. However, heat will be easier to remove from such heated air when it passes through a cooling coil. Higher temperatures for expected breakdowns include components that tolerate case temperatures of 85 degrees Celsius. In addition, the exit air temperature from tray 500 may be as high as 75 degrees Celsius. An output temperature may be most easily controlled by locating a temperature sensor at the actual output (or aiming it at the actual output). Such an output temperature may also be controlled or maintained within an acceptable temperature range by placing a temperature sensor at a location away from the output, but where the difference in temperature is adequately predictable.

Figure 5B:
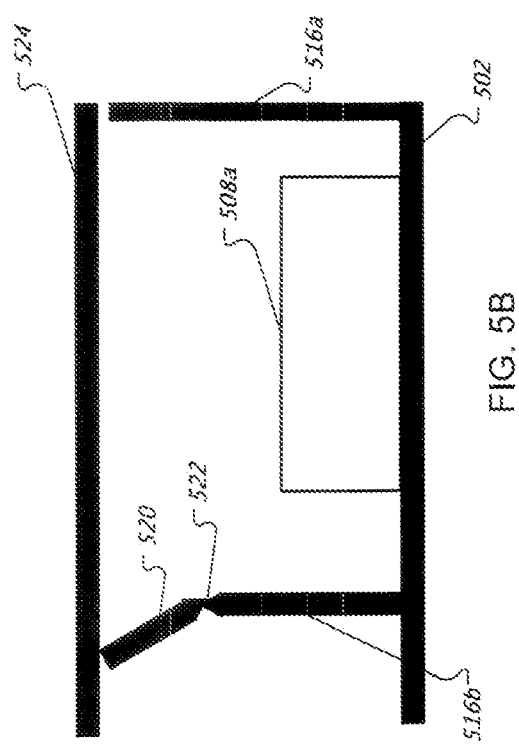
FIG. 5B shows a sectional view of a tray having a flexible divider.

FIG. 5B shows a sectional view of a tray having a flexible divider—here a section of the tray 500 in FIG. 5A. As shown, two substantially horizontal motherboards 502, 524 are stacked vertically, one over the other. A sidewall 516a extends upward at the edges of motherboard 502, and may seal or almost seal against the next motherboard 524 up. The motherboard is separated by a divider 516b, so that, for example, a hard drive 508a on one side of divider 516b does not face the heat of components on the other side of divider 516b, and so that the rate of air flow over the motherboard 502 on each side of divider 516b may be controlled, such as in the manners discussed above. Also, although the walls are shown as mounted on bare motherboards, they may also be mounted to flat trays into which the motherboards are placed. Where such trays are used, the motherboards may be set off from the trays (especially if the trays are made of electrically conductive materials) by stand offs that hold the motherboard above the trays or by a dielectric material such as a dielectric sheet placed between the tray and an associated board.

The divider 516b may itself be divided, such as by a score line 522 so that the divider has a lower portion that connects to motherboard 502, and an upper portion 520 that can flex or pivot, and thus can form a relatively tighter seal with the bottom of motherboard 524. The divider may, for example, be formed from a long strip of rigid yet somewhat flexible, or at least compressible, material. The long strip may be run through crimping wheel having a relatively sharp edge, so that the wheel permanently compresses material at the score line 522. The long strip may then be cut to length into pieces approximately the length of a motherboard, and each of the pieces may be affixed by appropriate mechanisms, to a motherboard. Other appropriate techniques for forming dividers for sealing to a next adjacent board or tray may also be used.

FIG. 6 shows a schematic side view of an example data center facility. This figure again shows a row of computer racks 606 front on a row of cooling modules 609. And again, the pitches of the two components have been chosen to differ—though they are shown as being spaced to match up at the ends of each row.

Though not shown, another level of racks may also be provided in the space above the level that is shown. Such a multi-level arrangement may increase the computer density available for a building having a particular footprint, and may be achieved, for example, by building a full two-story structure with fully reinforced floors and the like. Alternatively, a catwalk may be provided above the main floor, and the catwalk or other structures may support the weight of the racks and the cooling modules. For example, the components may be mounted on elevated rails that run lengthwise with the rows of computer racks and cooling modules (e.g., left to right in FIG. 6). The rails may thus support rows of computer racks and cooling units immediately above rows of racks and cooling units on the main level—essentially creating a second floor in a facility that has a high ceiling, using rails and catwalks. A lateral rail system may be provided at one end of the facility 600 (e.g., the left end in FIG. 6) to move components back-and-forth between longitudinal rails, and a lift system may also be provided to manipulate components down to the main floor where they can be handled with equipment such as fork lifts.

The facility 600 is also shown as having a number of support columns 607 rising vertically through the facility space. As can be seen in the figure, the cooling modules have been spaced along the rows to fit within the available space between the columns, and the columns have disappeared into the warm air capture plenum between those cooling modules.

In the figure, the data center includes a raised floor that defines an under-floor area 610. The under-floor area may be used to support piping such as coolant supply piping 612 and coolant return piping 614. Cooling water or another coolant may circulate in and out through the piping 612, 614 to serve cooling coils in the cooling modules.

The pictured system cools the returned water that is to be supplied back to the facility via cooling plant 604. Cooling plant 604 may include various components needed to provide cooled water or other fluids to the computer racks in the facility 600. In some implementations, the cooling plant 604 may be made up of modular units, such as a base unit that contains many of the pumps and heat exchanging equipment for providing cooling water, such as in a rectangular steel frame that is capable of being shipped on a standard train bed or truck bed. The cooling plant 604 may also include a number of cooling towers 622 that can be lifted into position on top of the base unit once the base unit is installed. Again, such modular design may permit the cooling plant 604 to be built and tested off-site and transported to a site, so as to increase quality and decrease delays and costs that may be associated with more on-site assembly.

The cooling plant may generally include a heat exchanger 626 for removing heat from the cooling water and passing it to cooling tower water; and cooling towers 622, to pass the accumulated heat to the ambient air through evaporation and cooling of the cooling tower water. In general operation, the cooling plant 604 may provide sufficient cooling from the cooling tower/heat exchanger/cooling coil system, though a powered refrigeration system such as a chiller 620 may be provided for peak loads, such as when the outdoor ambient dew point is very high and the cooling tower cannot provide sufficient cooling alone. Control parameters for the system may also be set so as to avoid most or any need for the use of chillers or other such items.

The temperatures of each portion of the system 600 may be selected to be relatively high, so as to permit more efficient operation of the system 600, than if the temperatures were lower. For example, relatively high air temperatures in the system (e.g., air entering a cooling coil over 43° C. (110° F.) and exiting temperature above 21° C. (70° F.) or above 25° C. (77° F.) may in turn permit for relatively high cooling water temperatures (e.g., water entering a cooling coil around 20° C. (68° F.) and exiting around 40° C. (104° F.) because the amount of heat that can be taken out of the air is generally proportional to the difference in temperature between the water and the air. If the difference between air and coolant temperatures can be kept at an acceptable level, where the coolant temperatures are high enough that evaporative cooling (e.g., cooling through a cooling tower, without further cooling via chiller) is sufficient to provide cooling to the system 600, the relatively high electrical infrastructure and operating costs of a chiller (or many chillers) may be avoided.

Cooling water may be provided from a cooling water circuit powered by pump 616. The cooling water circuit may be formed as a direct-return, or indirect-return, circuit, and may generally be a closed-loop system. Pump 616 may take any appropriate form, such as a standard centrifugal pump. Heat exchanger 626 may remove heat from the cooling water in the circuit. Heat exchanger 626 may itself take any appropriate form, such as a plate-and-frame heat exchanger or a shell-and-tube heat exchanger.

Heat may be passed from the cooling water circuit to a condenser water circuit, or cooling tower water circuit, which includes heat exchanger 626, pump 624, and cooling towers 622. Pump 624 may also take any appropriate form, such as a centrifugal pump. Cooling towers 622 may be, for example, one or more forced draft towers, induced draft towers, or hybrid cooling towers. The cooling towers 622 may be considered free (or relatively inexpensive) cooling sources, because they require power only for movement of the water in the system and in some implementations the powering of a fan to cause evaporation; they may not require operation of a compressor in a chiller or similar structure.

As shown, the fluid circuits may create an indirect waterside economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 626, and routing cooling tower water (condenser water) directly to cooling modules 609. Such an implementation may be more efficient, as it removes one heat-exchanging step. However, such an implementation also causes water from the cooling towers 622 to be introduced into what would otherwise be a closed system. As a result, the system in such an implementation may be filled with water that may contain bacteria, algae, and atmospheric contaminants, and may also be filled with other contaminants in the water. Such an implementation may require extensive water filtration and chemical conditioning. A hybrid tower, as discussed above, may provide similar benefits without the same detriments.

Various control valves may control and mix water in the cooling plant 604 in various convention manners. A control valve is provided in the condenser water circuit to supply make-up water to the circuit. Make-up water may generally be needed because the cooling towers 622 operate by evaporating large amounts of water from the circuit. The control valve may be tied to a water level sensor in the cooling tower 622 basins.

Optionally, a separate chiller circuit that uses a chiller 620 may be provided. Operation of cooling plant 604 may switch partially or entirely to this circuit during times of extreme atmospheric ambient (i.e., hot and humid) conditions or times of high heat load in the facility 600. Controlled mixing valves 628 are provided for electronically switching to the chiller circuit, or for blending cooling from the chiller circuit with cooling from the condenser circuit. Pump 624 may supply tower water to chiller 620, and the heat exchanger 626 or supply water only to the heat exchanger 626 when the chiller 620 is not in service. Chiller 620 may take any appropriate form, such as a centrifugal, reciprocating, or screw chiller, or an absorption chiller.

Pumps 616 and 624 may be provided with variable speed drives. Such drives may be electronically controlled by a central control system to change the amount of water pumped by each pump in response to changing set points or changing conditions in the system.

In operation, cooling plant 604 may respond to signals from various sensors placed in the facility 600. The sensors may include, for example, thermostats, humidistats, flowmeters, and other similar sensors. In one implementation, one or more thermostats may be provided in warm air capture plenums in the cooling modules 609, and one or more thermostats may be placed in workspace 608. In addition, air pressure sensors may be located in workspace 608, and in the warm air capture plenums. The thermostats may be used to control the speed of associated pumps, so that if temperature begins to rise, the pumps turn faster to provide additional cooling water. Pressure sensors may be used to control the fans to maintain a constant pressure in the warm air capture plenum. Where mechanisms for increasing cooling, such as speeding the operation of pumps, are no longer capable of keeping up with increasing loads, a control system may activate chiller 620 and associated pumps and may modulate control valves 628 accordingly to provide additional cooling.

In some implementations, multiple cooling plants may be provided for a facility 600. The plants may be aligned along one exterior wall of the facility 600, and may be at an end of rows in the datacenter. For instance, each cooling plant 600 may be associated with, and positioned at the end of, a set number of rows inside the facility, such as a single row or two rows. The particular cooling plant may then serve that row or rows. Additional diversity and redundancy may also be provided by connecting each of the cooling plants to a common header and each of the rows to a common header, so that every row can still access cooling water from the header even if one of the plants goes off line (though perhaps the cooling water temperature will be greater than a setpoint then).

Figure 7:
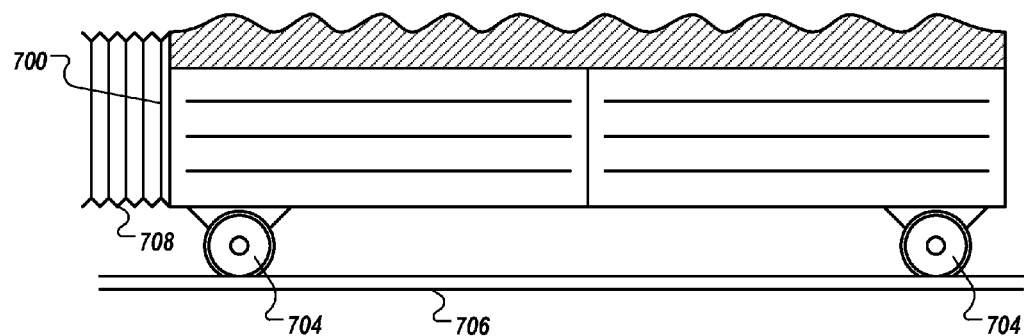
FIG. 7 shows an alternative base for a cooling module.

FIG. 7 shows an alternative base for a cooling module 700. The module 700 may be similar to the module 100 shown in FIG. 1A, 2, or 3. However, in this implementation, the module 700 is provided with wheels 704 that may be aimed along a row of modules and may be spaced to interface with rails 706, like railroad rails, installed in a facility. In addition, a pleated bellows 708 may be provided between modules to stretch and compress as the modules are moved relative to each other on the rails 706. The bellows 708 are shown here on a front edge of the module end, though they may be provided only on top and bottom edges if computer racks need to back up to the space between modules and provide warm air to the space between the modules. A similar bellows may be use to connect the cold air plenums of adjacent cooling modules, to reduce the negative effects of failures of fans or groups of fans.

The wheels 704 may provide for easier manipulation and adjustment of cooling units in a facility. In particular, cooling units may be moved up and down a row to match particular cooling requirements and to better match cooling capacity to heating load.

Figure 8:
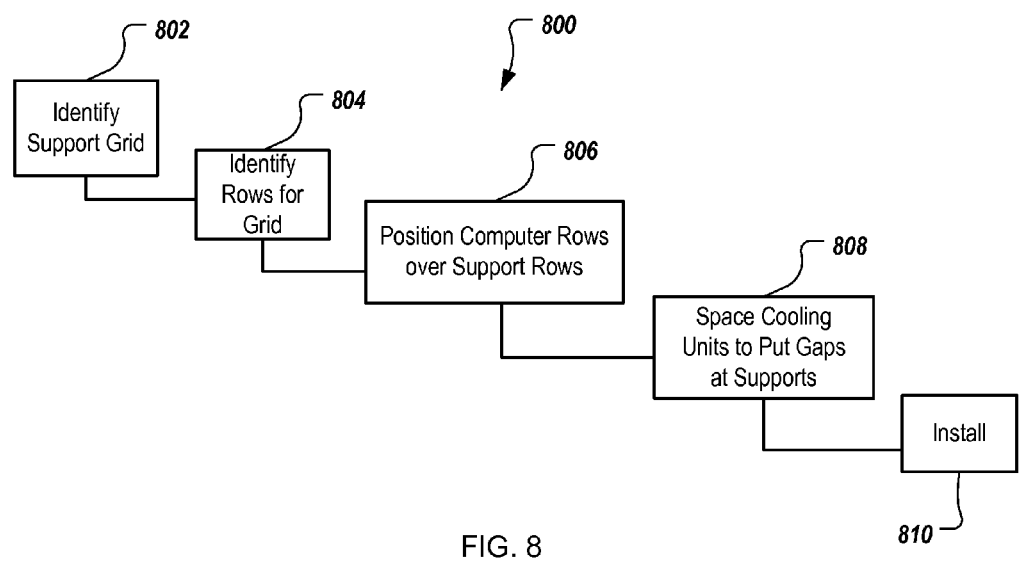
FIG. 8 is a flow chart of a process for locating rows in a data center so as to hide structural columns in the data center.

FIG. 8 is a flow chart of a process 800 for locating rows in a data center so as to hide structural columns in the data center. At box 802, a grid of structural columns is identified. Such identification might involve locating the columns in an actual building or on a plan, and measuring the locations of, and spacing between, the columns.

At box 804, rows in the structural grid are identified. Such an identification may involve identifying a direction for the rows in the computer racks, i.e., whether the racks are going to run North-South or East-West. Such a direction may have been previously set, or may be determined according to a direction that will permit the highest density of computing components or according to other factors. The rows in the structural grid are then the aligned building columns running in the direction of the rows of racks.

At box 806, the computer rows are positioned laterally and spaced from each other so that the computer rows (and, in particular, the cooling module row that is part of the computer row) lie on top of the structural columns. When there is sufficient space between the column-enveloping rows, additional rows may be added in the space for greater component density; generally, such space may require space for a pair of rows racks, a row of cooling units, and aisles on each side of the racks. With the rows positioned, then the lengthwise positioning of the cooling modules within the structural column-enveloping rows may be set. For example, the space between two columns may be measured, and the length of a typical module may be divided into that space and rounded downward (box 808). With the remaining extra space between columns, the modules may then be spread out. Where the actions just described are performed for a design rather than an actual installation, the process may then proceed to installing the components according to the design (box 810).

Figure 9:
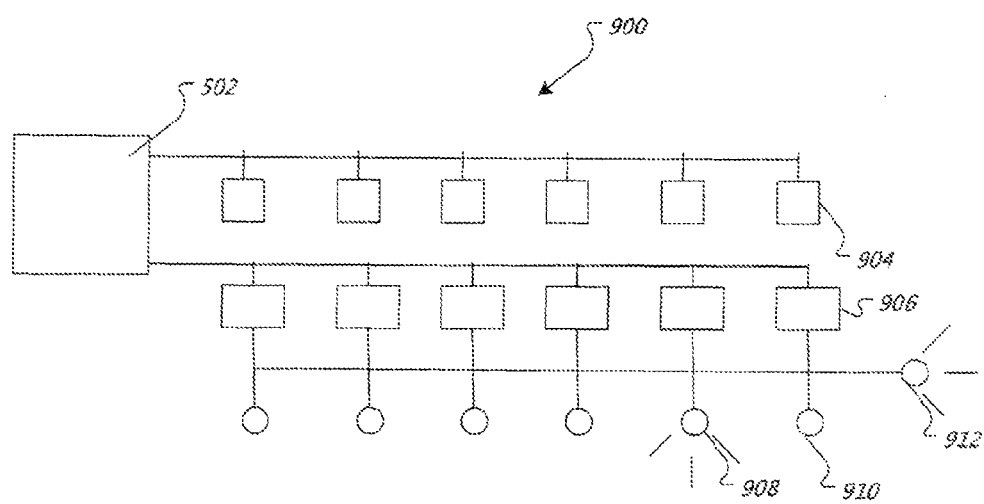
FIG. 9 is a schematic diagram of service notification system for use in a data center environment.

FIG. 9 is a schematic diagram of service notification system 900 for use in a data center environment. In general, the system 900 includes a number of control nodes that can cause various service lights to be energized when a fault is sensed or upon the occurrence of other such events. The lights may be positioned above and in front of individual racks or bays in rows in a data center, such as those shown in the figures above. Energizing of a particular light may indicate to a service technician that the corresponding rack or bay requires service. In addition, the light may also help the technician better see what he or she is doing, particularly when the data center lights are normally turned off or dimmed.

In an exemplary configuration, the lights may be addressable and may be controlled by control nodes such as environmental controller 906. Environmental controller 906 may, for example, control fans and other air circulation and cooling equipment. Environmental controller 906 may be in receipt of signals from one or more fault sensors, and may directly cause illumination of light 910 when there is a fault. In this example, there is no fault at the rack or bay associated with light 910, but there is a fault with the rack or bay associated with light 908.

Environmental controller 906 may report information back to central controller 502 and/or receive commands from central controller 502. Central controller 502 may include, for instance, a main control system that permits control of multiple systems from a single terminal, and can relay information or commands from one system or sub-system to another. Each of the lights may be addressable either directly or indirectly (e.g., though environmental controllers) from the central controller 502.

Central controller 502, for example, may also be in communication with a number of server controllers such as server controller 904. The server controllers may monitor and control the operation of servers in the racks and bays, and each rack or bay may have a server controller associated with it, or the allocation of server controllers may occur in a variety of arrangements.

The energizing of lights may occur in a variety of manners. For example, a failure of a mechanical system may cause environmental controller 906 to cause light 910 to be illuminated. Likewise, a failure in a computer may cause server controller 904 to said a fault signal back to central controller 502, and central controller 502 may in turn send a signal to environmental controller 906 to cause light 910 to be illuminated.

The lights in a row (which may correspond to a row, such as a row shown in FIG. 4) may be wired such that illumination of any light in row will also cause a light 912 at the end of the row to light. As a result, a technician may be alerted to a fault and may readily locate the fault. In particular, the technician will quickly see a light illuminated at the end of the rows as he enters a room, quickly turn the corner into a row, and quickly see a light illuminated in front of the rack or bay that has a fault or other event that requires attention.

A number of embodiments have been described. Nevertheless, it will be understood that various modifications may be made. For example, various forms of the flows shown above may be used, with steps re-ordered, added, or removed. Also, although several applications of the cooling systems and methods have been described, it should be recognized that numerous other applications are contemplated. Moreover, although many of the embodiments have been described in relation to particular geometric arrangements of cooling and ventilation units, and electronics racks, various other arrangements may also be used. Accordingly, other embodiments are within the scope of the following claims.

What is claimed is:

1. A rack-mount computer system, comprising:
a first row of computer racks;
a second row of computer racks, the second row disposed parallel and back-to-back to the first row, such that a warm air aisle is formed between the first row and the second row, and an ambient air space is disposed above the first and second rows and on open sides of the first and second rows that are opposite the warm air aisle; and
a plurality of cooling devices disposed at least partially within the warm air aisle, wherein a particular cooling device is configured to receive air from the ambient air space and through both of the first and second rows, cool the air, and output cooled air into the ambient air space, wherein the cooling devices comprise coils arranged within the warm air aisle between the open sides of the first and second rows of computer racks, the warm air aisle in fluid communication with the ambient air space only through one or more of the first and second rows and the cooling devices.

2. The rack-mount computer system of claim 1, wherein a temperature of an airflow on a cold side of the coils is substantially equal to a temperature of the ambient air space, and a temperature of an airflow between the first and second rows and a warm side of the coils is substantially equal to a temperature of the warm air aisle.

3. The rack-mount computer system of claim 2, wherein a temperature gradient between the ambient air space and the cold side of the coils is at least partially based on fan motor heat added to air circulated through the cooling devices.

4. The rack-mount computer system of claim 1, wherein a portion of the warm aisle extends above the first and second rows, and at least a portion of one or more of the plurality of cooling devices is disposed above the first and second rows.

5. The rack-mount computer system of claim 1, wherein the plurality of cooling devices are configured to carry substantially all of the cooling load of the first and second rows of computer racks.

6. The rack-mount computer system of claim 1, wherein particular ones of the computer racks in the first and second row are disposed on rollers that enable the computer racks to be moved without being lifted above a surface on which the rollers ride.

7. The rack-mount computer system of claim 4, wherein particular ones of the computer racks include a skirt that, when disposed in a sealing position, closes off a space near the rollers and under the computer rack, to thermally isolate, near the skirt, air from the ambient air space and air from the warm air aisle.

8. The rack-mount computer system of claim 7, wherein the skirt comprises a flexible sealing member.

9. The rack-mount computer system of claim 7, wherein the skirt, when disposed in a non-sealing position, is moved away from the surface to facilitate movement of the computer rack.

10. The rack-mount computer system of claim 1, further comprising a barrier that thermally isolates the warm air aisle from the ambient air space.

11. The rack-mount computer system of claim 10, wherein the barrier comprises one or more blanking panels between a pair of computer racks in the first row or the second row, wherein the one or more blanking panels thermally isolates the warm air aisle from the ambient air space in a region between the pair of computer racks.

12. The rack-mount computer system of claim 10, wherein at least one of the cooling devices comprises:
a frame enclosing at least a portion of the cooling device; and
one or more air movers attached to the frame;
wherein the barrier is attached to the frame, and the cooling device is positioned between the first and second rows of computer racks such that the warm air aisle is defined between sides of the first and second rows of computer racks opposite the open sides and the cooling device.

13. The rack-mount computer system of claim 12, wherein the cooling device further comprises one or more rollers mounted on the frame that enable the cooling device to be moved without being lifted above a surface on which the rollers ride.

14. The rack-mount computer system of claim 10, further comprising a barrier between a pair of computer racks in the first row or the second row, wherein the barrier thermally isolates the warm air aisle from the ambient air space in a region between the pair.

15. The rack-mount computer system of claim 14, wherein the barrier comprises a flexible, sealing member that is configured to thermally isolate the warm air aisle from the ambient air space for a range of distances between the pair of computer racks.

16. The rack-mount computer system of claim 1, wherein each computer rack comprises a plurality of circuit boards, each circuit board having a front edge that faces the ambient air space and a back edge that faces the warm air aisle.

17. The rack-mount computer system of claim 16, wherein each circuit board slideably engages a slot in the computer rack, wherein the slot is deeper than the circuit board is long, such that when the circuit board is engaged in the slot, a space is formed between the warm-aisle side of the computer rack and the back edge.

18. The rack-mount computer system of claim 17, wherein the space is common to multiple slots, such that air can flow laterally, within the computer rack, from one slot to another.

19. The rack-mount computer system of claim 1, wherein the first and second rows of computer racks are disposed against, or in close proximity to, the plurality of cooling devices.

20. The rack-mount computer system of claim 1, wherein each of the computer racks has a width that is parallel to the first and second rows, and each of the cooling devices has a length that is parallel to the first and second rows; wherein the width and the length are dimensioned differently, such that the cooling devices and the computer racks are offset relative to each other.

21. The rack-mount computer system of claim 20, wherein the width and length are such that a maximum pitch of the computer racks is different than a maximum pitch of the cooling devices.

22. The rack-mount computer system of claim 1, wherein spacing of the computer racks in the first row or the second row, or spacing of the plurality of cooling devices, depends on a power density parameter of the computer system.

23. The rack-mount computer system of claim 1, wherein spacing of the computer racks in the first row or the second row, or spacing of the plurality of cooling devices, depends on a location of an architectural support member adjacent to at least one of the computer racks or cooling devices.

24. The rack-mount computer system of claim 1, wherein the back sides of the first and second rows of computer racks are substantially entirely open to the warm aisle, and front sides of the computer racks are open to the ambient space on a side of the racks opposite the warm air aisle so as to draw cool air from the ambient space and provide air that has been warmed while passing through the racks to the warm air aisle and the cooling devices.

25. A method for cooling heat generating devices, comprising:
   providing a first row of computer racks in a data center;
   providing a second row of computer racks in the data center in a location relative to the first row of computer racks so that the second row is disposed parallel to the first row, and a back side of the first row faces a back side of the second row so that an ambient air space is defined above the first and second rows of computer racks and adjacent front sides of the first and second rows opposite the back sides;
   providing a plurality of cooling devices in a location relative to the first and second rows of computer racks, such that at least a portion of the cooling devices are disposed between the first and second rows within a warm air plenum that is formed between the backs of the first and second rows, the cooling devices comprising coils arranged within the warm air plenum between the back sides of the first and second rows of computer racks, the warm air plenum in fluid communication with an ambient air space adjacent the front sides only through one or more of the front sides of the first and second rows and the cooling devices;
   circulating cool air from the ambient air space through front sides of the first and second rows of computer racks and over heat generating devices supported in the computer racks to warm the cool air;
   circulating the warm air from back sides of the first and second rows opposite the front sides into the warm air plenum and
   circulating the warm air from the warm air plenum through cooling coils in the plurality of cooling devices and to the ambient air space.

26. The method of claim 25, further comprising circulating warm air from the back sides of the first and second rows to at least a portion of the warm air plenum located above one or both of the first and second rows of computer racks.

27. The method of claim 25, further comprising removing, with the cooling coils, substantially all of the heat added to the cool air to warm the cool air.

28. The method of claim 25, wherein providing a first row of computer racks in a data center comprises rolling the first row of computer racks into the data center without lifting the computer racks above a surface of the data center.

29. The method of claim 28, further comprising sealing a space near the rollers and under the computer racks to thermally isolate air from the ambient air space and air from the warm air plenum.

30. The method of claim 25, further comprising thermally isolating air from the ambient air space and air from the warm air plenum in a region between a pair of computer racks in the first row or the second row.

31. The method of claim 25, further comprising circulating air laterally between adjacent computer racks in the first row or the second row in a region between at least a portion of the heat generating devices and the backs of the adjacent computer.

32. The method of claim 25, further comprising:
   disabling one of the cooling devices in the plurality of cooling devices, the disabled cooling device located between a first computer rack in the first row and a first computer rack in the second row;
   circulating cool air from the ambient air space through the front sides of the first computer racks in the first and second rows by fans associated with at least one cooling device located immediately adjacent the disabled cooling device and over heat generating devices supported in the first computer racks to warm the cool air;
   circulating the warm air from back sides of the first computer racks into the warm air plenum and
   circulating the warm air from the warm air plenum through one or more cooling coils associated with the at least one cooling device located immediately adjacent the disabled cooling device and to the ambient air space.

\* \* \* \* \*